(12) United States Patent
Zimmerman et al.

(10) Patent No.: US 7,525,641 B2
(45) Date of Patent: Apr. 28, 2009

(54) SYSTEM AND METHOD FOR UNIFORMITY CORRECTION

(75) Inventors: Richard C. Zimmerman, Brookfield, CT (US); Eric B. Catey, Danbury, CT (US); David A. Hult, Danbury, CT (US); Alexander C. Kremer, Stamford, CT (US); Heine Melle Mulder, Veldhoven (NL); Hendrikus Robertus Marie Van Greevenbroek, Eindhoven (NL); Roberto B. Wiener, Eindhoven (NL)

(73) Assignee: ASML Holding N.V., Veldhoven (NL)

( * ) Notice: Subject to any disclaimer, the term of this patent is extended or adjusted under 35 U.S.C. 154(b) by 486 days.

(21) Appl. No.: 11/295,517

(22) Filed: Dec. 7, 2005

(65) Prior Publication Data

US 2007/0103665 A1    May 10, 2007

Related U.S. Application Data

(63) Continuation-in-part of application No. 11/022,888, filed on Dec. 28, 2004, now Pat. No. 7,173,688.

(51) Int. Cl.
G03B 27/72    (2006.01)
G03B 27/42    (2006.01)

(52) U.S. Cl. .......................................... 355/69; 355/53

(58) Field of Classification Search .................. 355/53, 355/67–69; 250/548, 292.2
See application file for complete search history.

(56) References Cited

U.S. PATENT DOCUMENTS 6,097,474 A * 8/2000 McCullough et al. ......... 355/69
6,771,350 B2    8/2004 Nishinaga
6,772,350 B1    8/2004 Belani et al.
6,813,004 B1    11/2004 Horikoshi et al.
7,026,082 B2    4/2006 Eurlings et al.
7,027,130 B2    4/2006 Spence et al.
7,119,883 B2 * 10/2006 Roux et al. .................... 355/69
7,173,688 B2    2/2007 Wiener et al.
7,196,774 B2 * 3/2007 Won et al. ..................... 355/71
7,333,176 B2    2/2008 Wiener et al.

FOREIGN PATENT DOCUMENTS

JP    2006-203192 A    8/2006

* cited by examiner

*Primary Examiner*—Hung Henry Nguyen
(74) *Attorney, Agent, or Firm*—Sterne, Kessler, Goldstein & Fox P.L.L.C.

(57) ABSTRACT

A system and method for uniformity correction is provided. The system includes a plurality of winged correction elements inserted into the illumination field in a defined configuration. Adjacent winged correction elements are overlapped to minimize induced uniformity ripple. Each winged correction element has a first protrusion on a longitudinal edge of the correction element and a second protrusion on the opposite longitudinal edge. The slope of a sloped edge of the first protrusion and the slope of a sloped edge of the second protrusion are tied to the slope of a gradient in the non-uniformity profile of the illumination field. In addition, the angles defined by the flat tip of the correction element and the sloped edge of the first and second protrusions are tied to the angle of a gradient of the illumination field.

11 Claims, 24 Drawing Sheets

Bank A

Bank B

END VIEW

SIDE VIEW

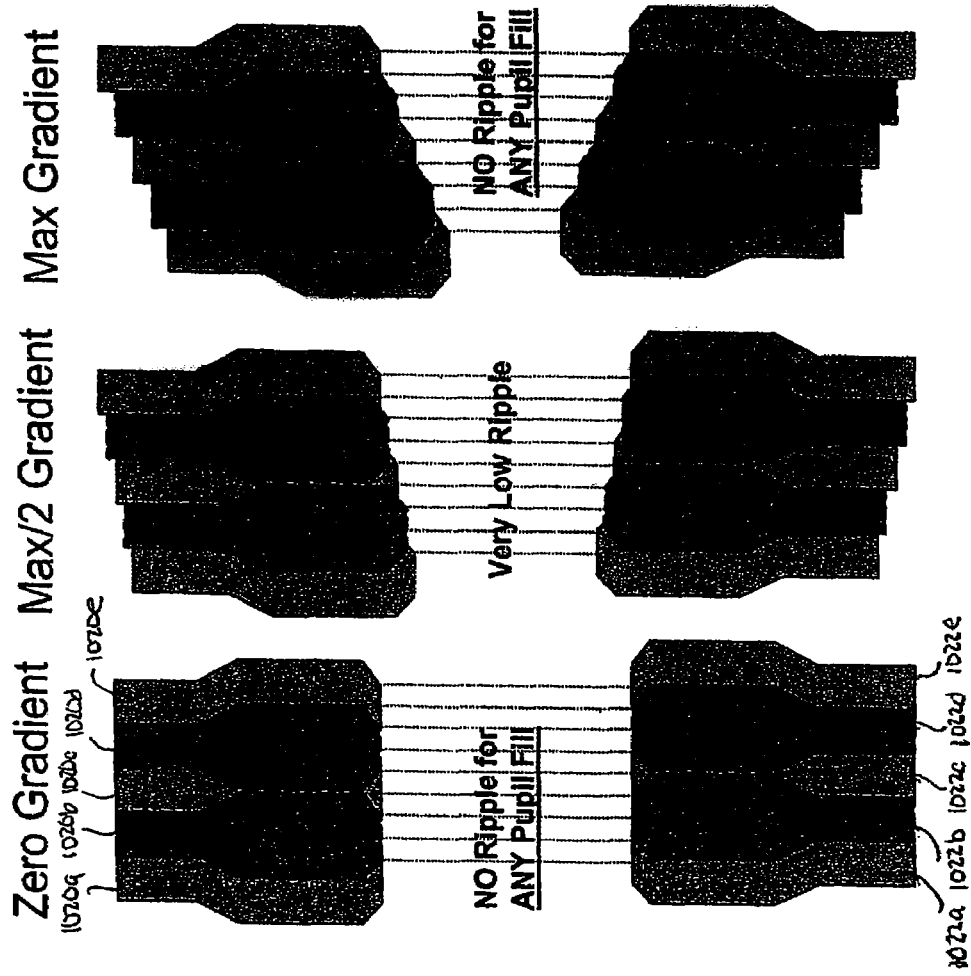

SYSTEM AND METHOD FOR UNIFORMITY CORRECTION

CROSS REFERENCE TO RELATED APPLICATIONS

This application is a continuation-in-part of U.S. application Ser. No. 11/022,888, entitled "Method for Calculating an Intensity Integral for Use in Lithography Systems," filed Dec. 28, 2004, now U.S. Pat. No. 7,173,688 which is incorporated herein by reference in its entirety.

FIELD OF THE INVENTION

The present invention is generally related to uniformity correction in lithography systems.

BACKGROUND OF THE INVENTION

Conventional lithography systems include, among other things, an illumination system to produce a uniform intensity distribution of a received laser beam. It is desirable that the resulting illumination be as uniform as possible and that any uniformity errors be kept as small as possible. Illumination uniformity influences the ability of an illumination system to produce uniform line widths across an entire exposure field. Illumination uniforrmity errors can significantly impact the quality of devices produced by the lithography system.

Techniques for correcting uniformity include correction systems that have multiple correction elements in the form of rectangular plates inserted from opposite sides of an illumination slot. The shape of these correction elements limits their ability to correct uniformity errors across a wide range of illumination systems and/or illumination modes. In addition, because of the finite nature of these correction elements, ripples are induced in the uniformity profile.

Therefore, what is needed is a uniformity correction system that compensates for uniformity errors across a wide range of illumination systems and illumination modes.

Furthermore, when correcting uniformity it is important to control the uniformity of the illumination pupil because it also has significant impact on lithography. To minimize illumination pupil non-uniformity induced by uniformity correction, the correction should be performed close to a reticle conjugate plane. However, uniformity correction techniques which use discrete segments produce increased uniformity ripple the closer they are to a reticle conjugate plane. Therefore, what is further needed is a uniformity correction system that can correct for uniformity ripple near a reticle conjugate plane.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 2A:
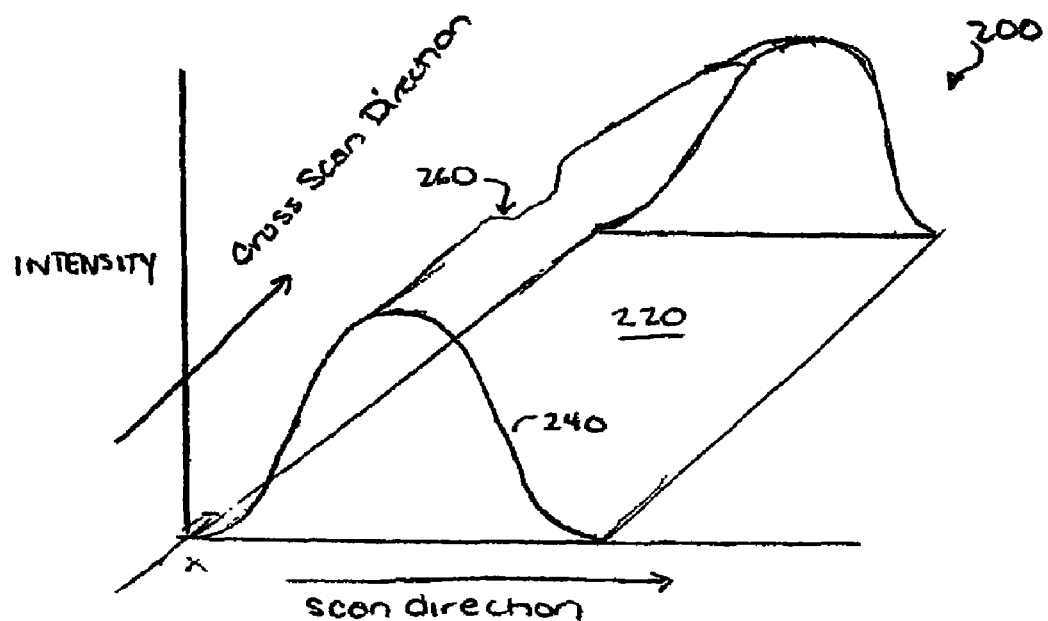
FIG. 2A illustrates the illumination profile of an exemplary rectangular illumination field.
Figure 2B:
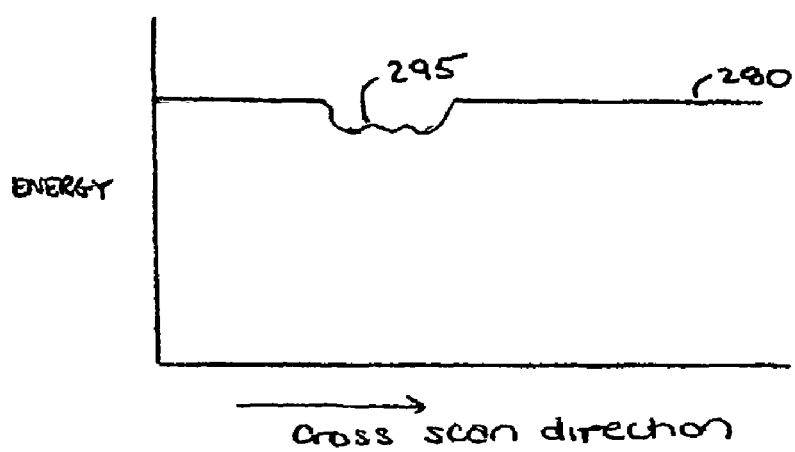

FIG. 2B graphically illustrates the scan-integrated illumination energy.

Figure 3A:
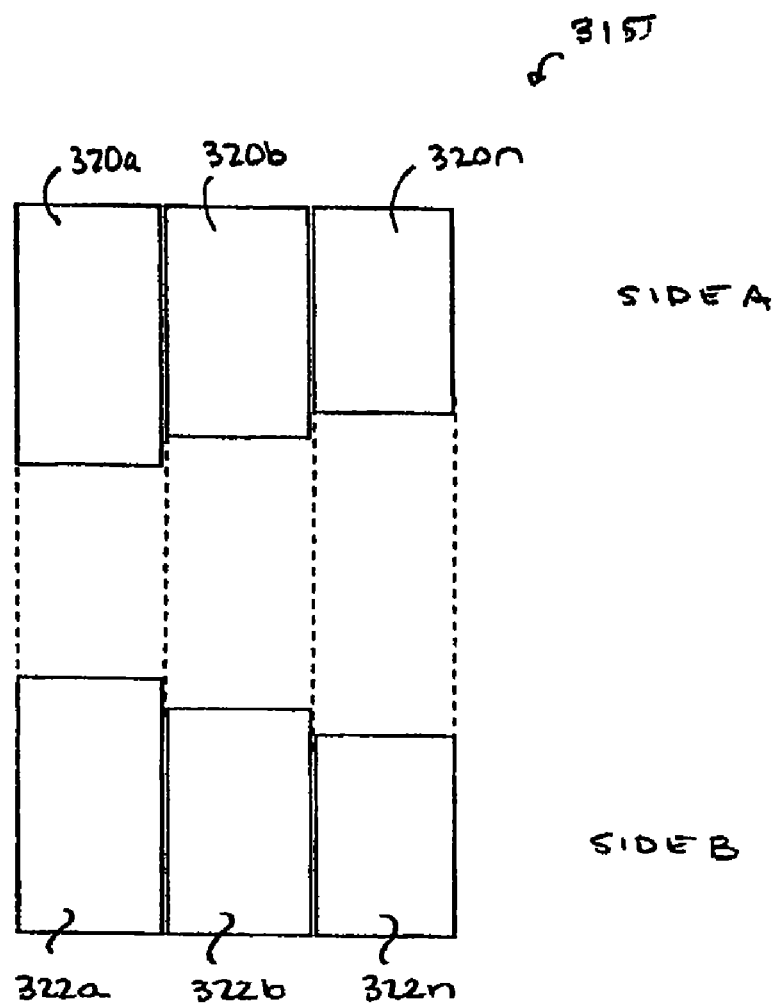
Figure 3B:
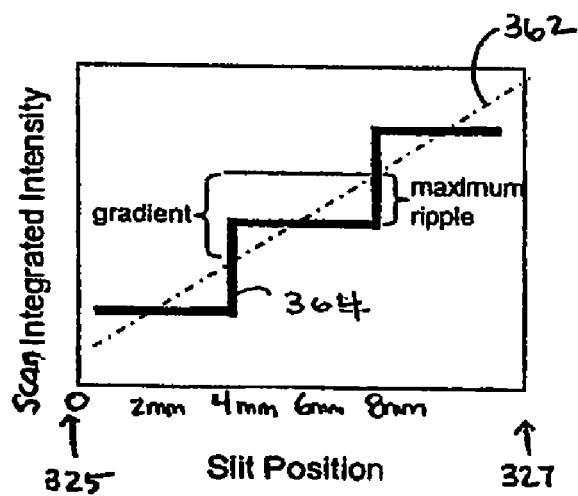

FIGS. 3A and 3B illustrate an exemplary uniformity correction system having multiple non-staggered rectangular correction elements and the residual error generated by the correction element configuration.

Figure 4A:
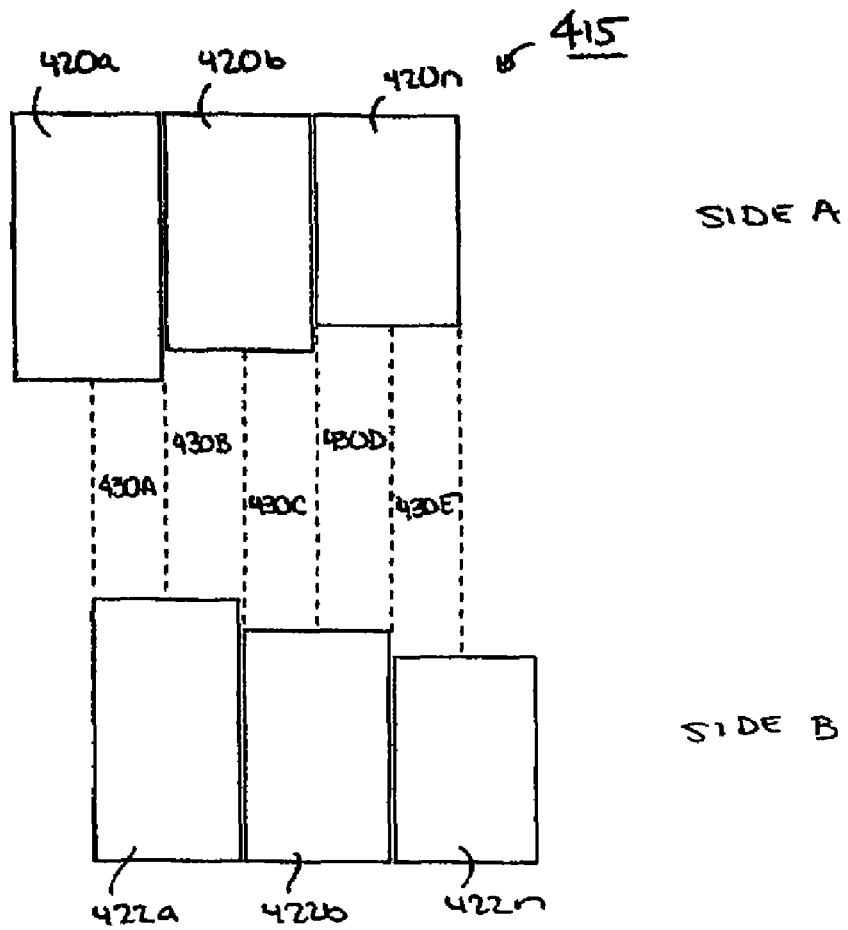
Figure 4B:
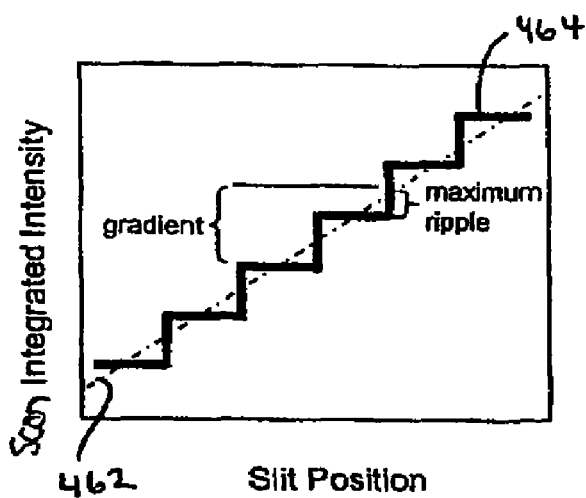

FIGS. 4A and 4B illustrate an exemplary uniformity correction system having multiple staggered rectangular correction elements and the residual error generated by the correction element configuration.

Figure 5:
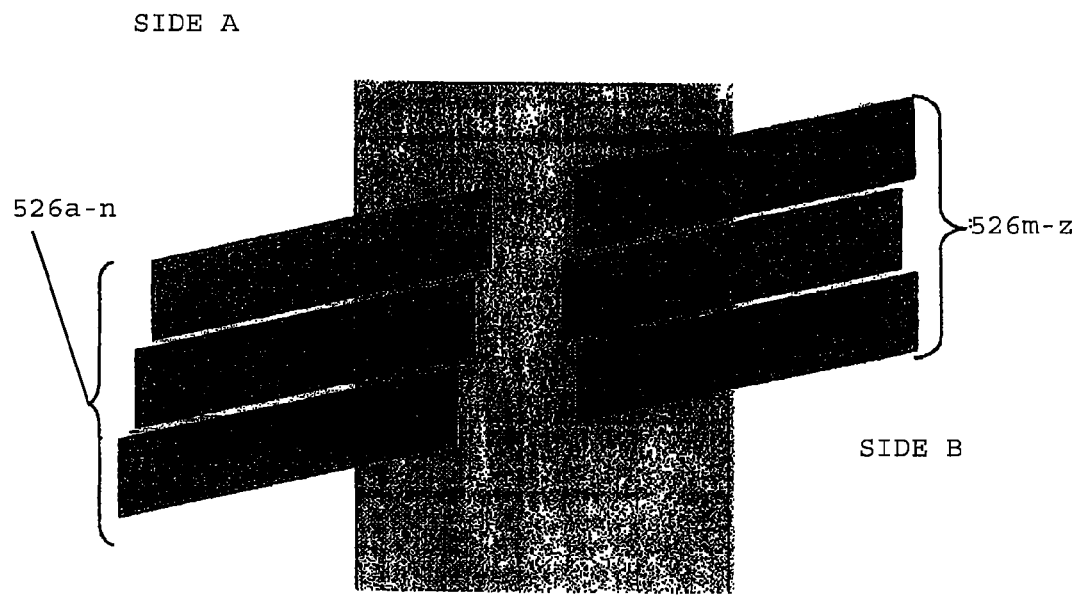

FIG. 5 illustrates an exemplary uniformity correction system having rectangular correction elements in a tilted configuration.

Figure 6:
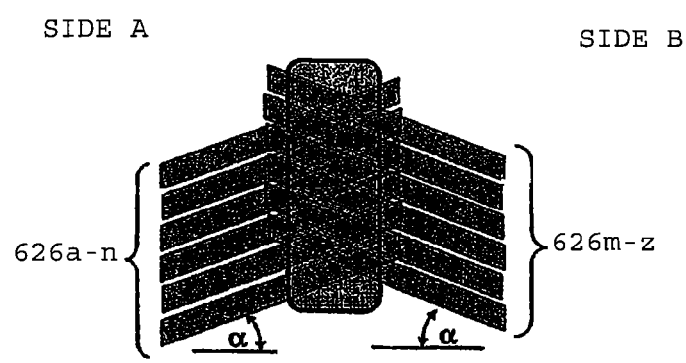

FIG. 6 illustrates an exemplary uniformity correction system having rectangular correction elements in a chevron configuration.

Figure 7A:
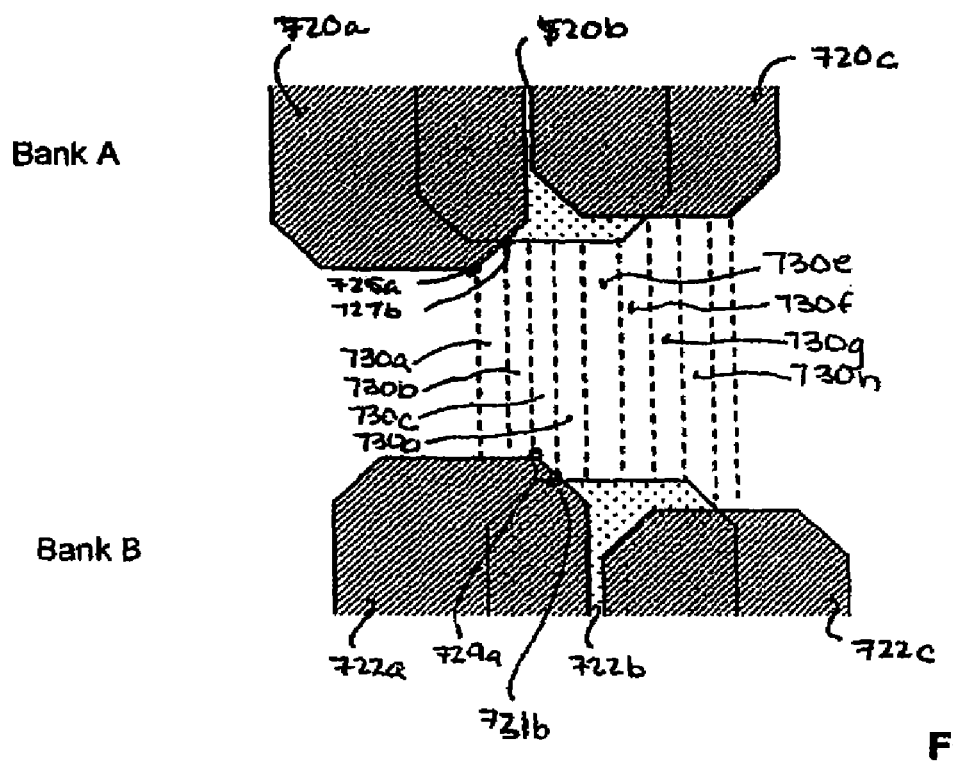
Figure 7B:
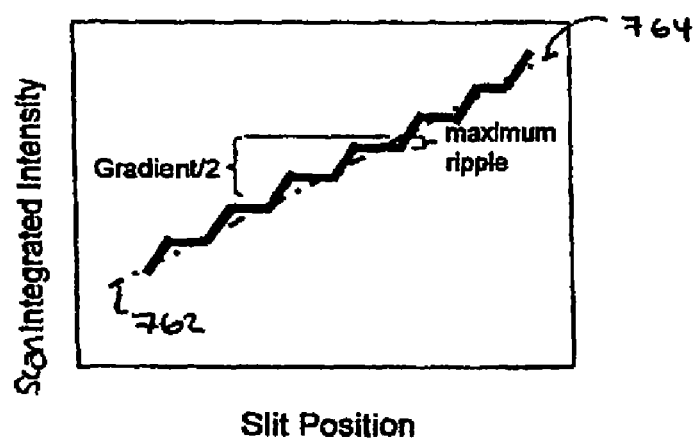

FIGS. 7A and 7B illustrate an exemplary uniformity correction system having multiple staggered winged correction elements and the residual error generated by the correction element configuration, according to an embodiment of the present invention.

Figure 8:
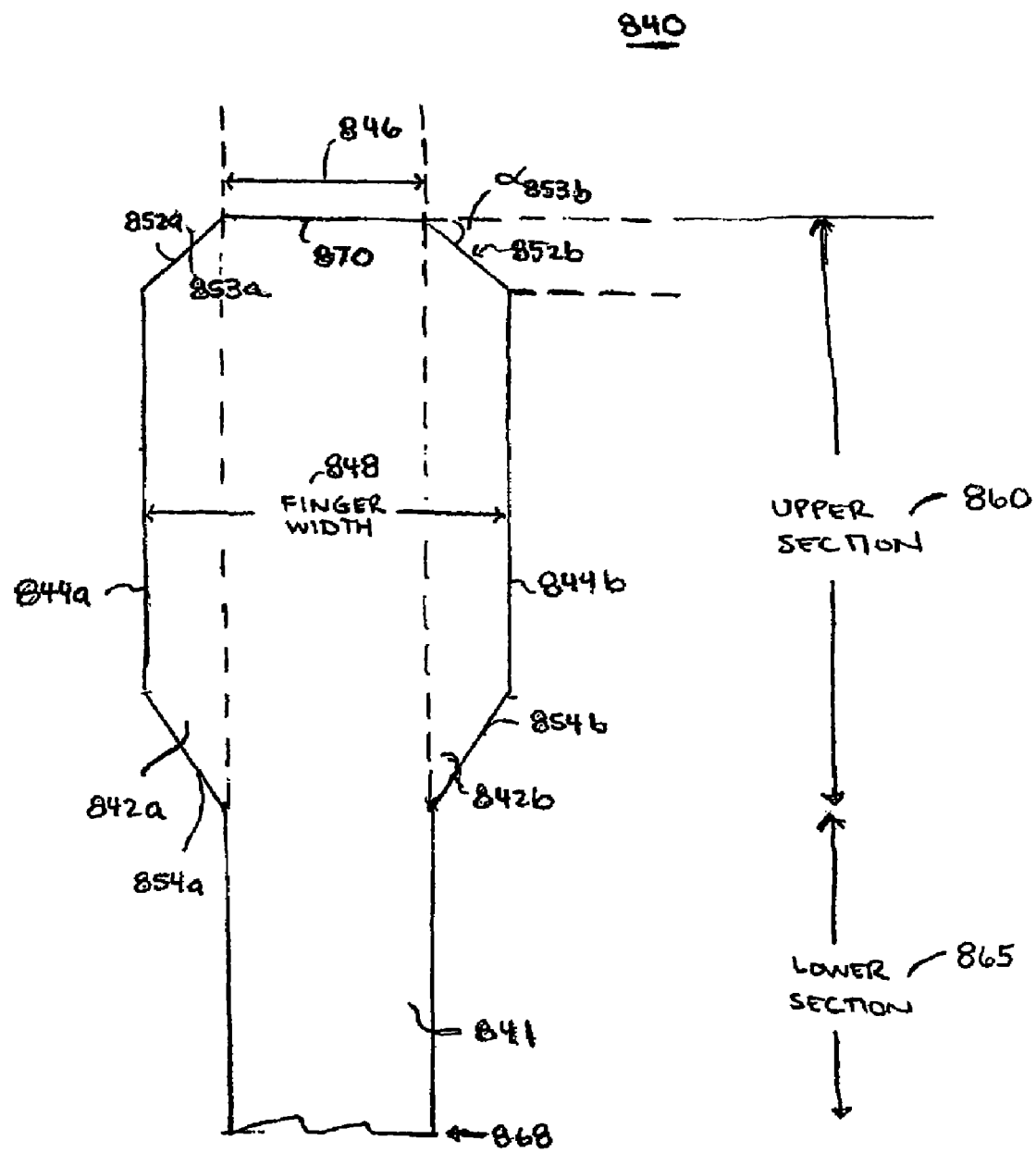

FIG. 8 illustrates an exemplary winged correction element 640 that can be used as one or more of the winged correction elements, according to an embodiment of the present invention FIGS. 9A through 9D illustrate exemplary configurations for a uniformity correction system having overlapping winged correction elements, according to an embodiment of the present invention.

FIGS. 10A through 10C illustrate the use of a uniformity correction system having staggered winged correction elements to correct for a range of gradients, according to an embodiment of the present invention.

Figure 11:
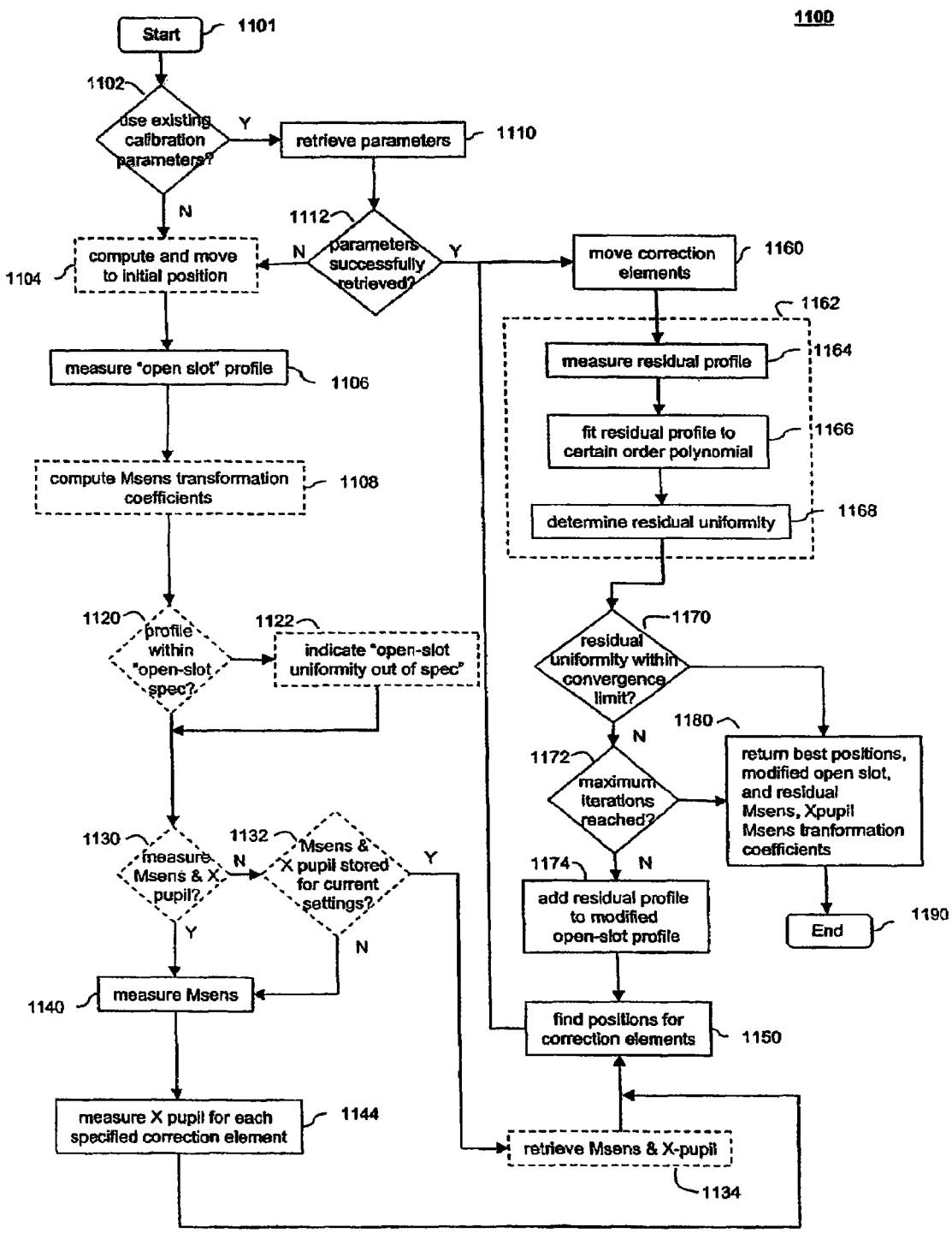

FIG. 11 depicts a flowchart of a method for uniformity correction for a uniformity correction system having multiple levels of correction elements, according to an embodiment of the invention.

Figure 12:
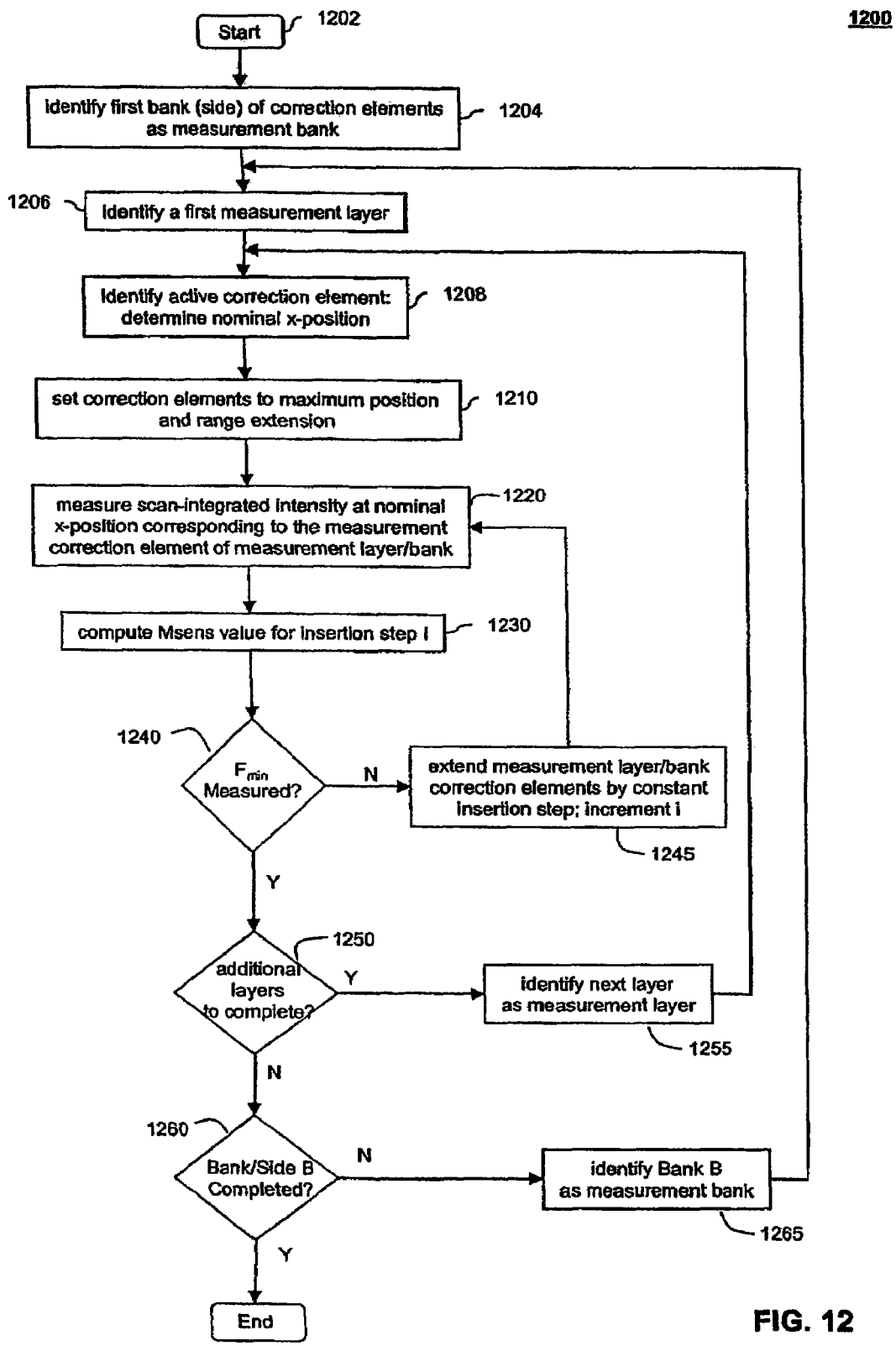

FIG. 12 depicts a flowchart of a method for measuring Msens (step 1140), according to an embodiment of the invention.

Figure 13:
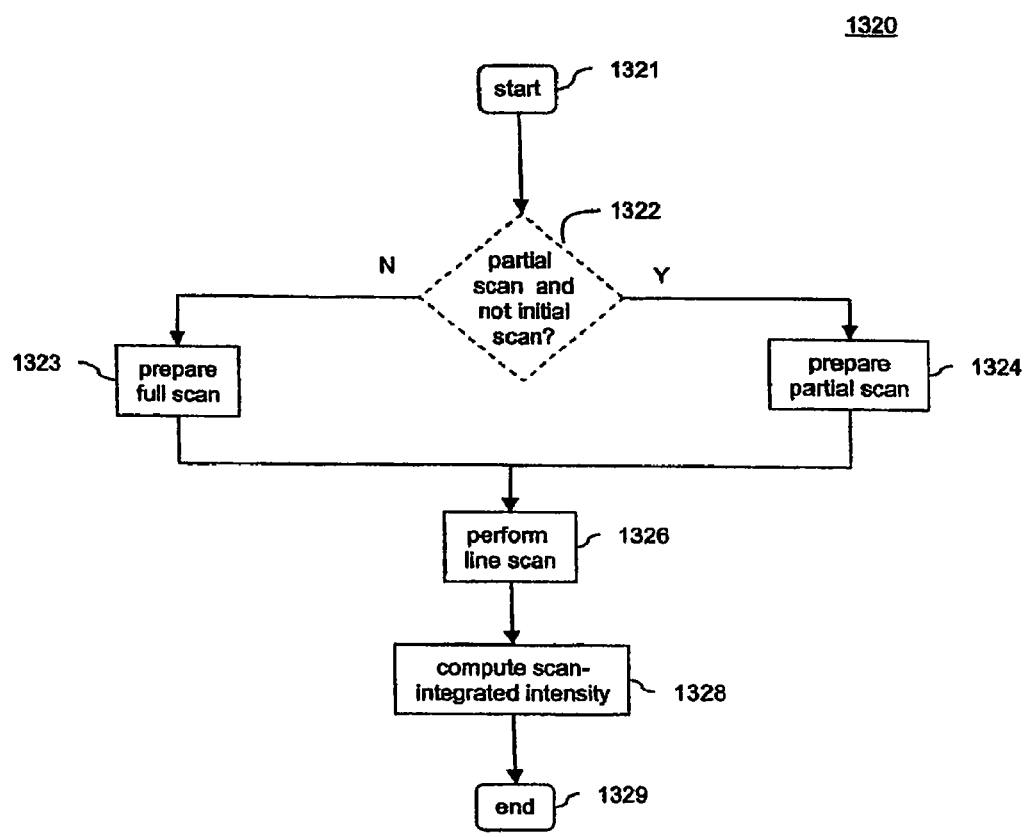

FIG. 13 depicts a flowchart of a method for measuring scan-integrated intensity, according to an embodiment of the invention.

Figure 14:
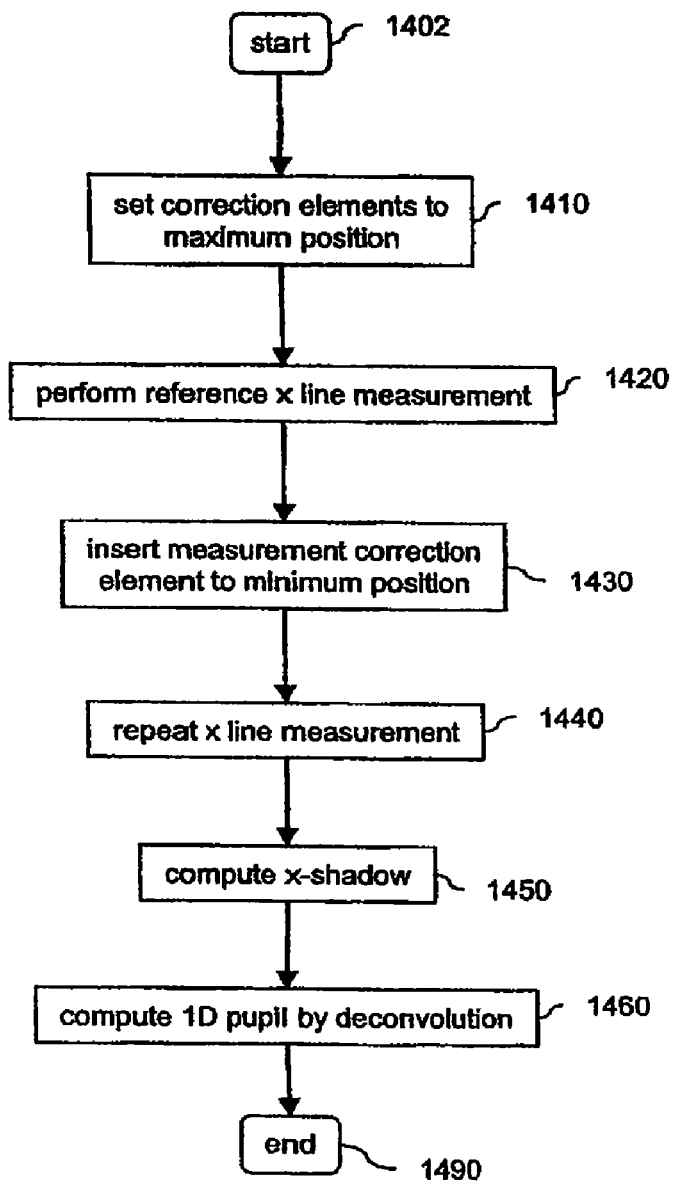

FIG. 14 depicts a flowchart of a method for measuring X-pupil, according to an embodiment of the invention.

Figure 15:
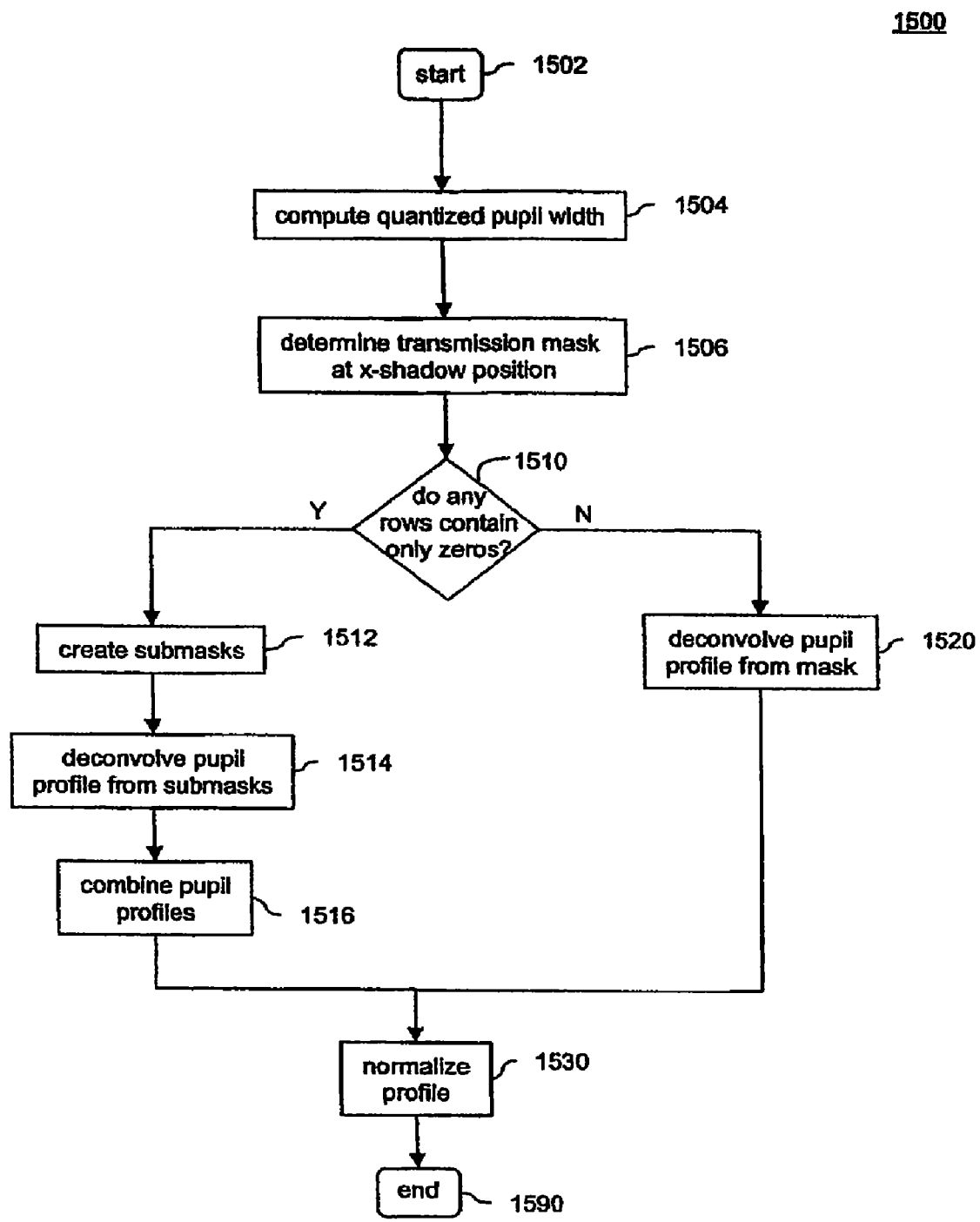

FIG. 15 depicts a flowchart of a method for computing the 1-D pupil by deconvolution, according to an embodiment of the invention.

Figure 16:
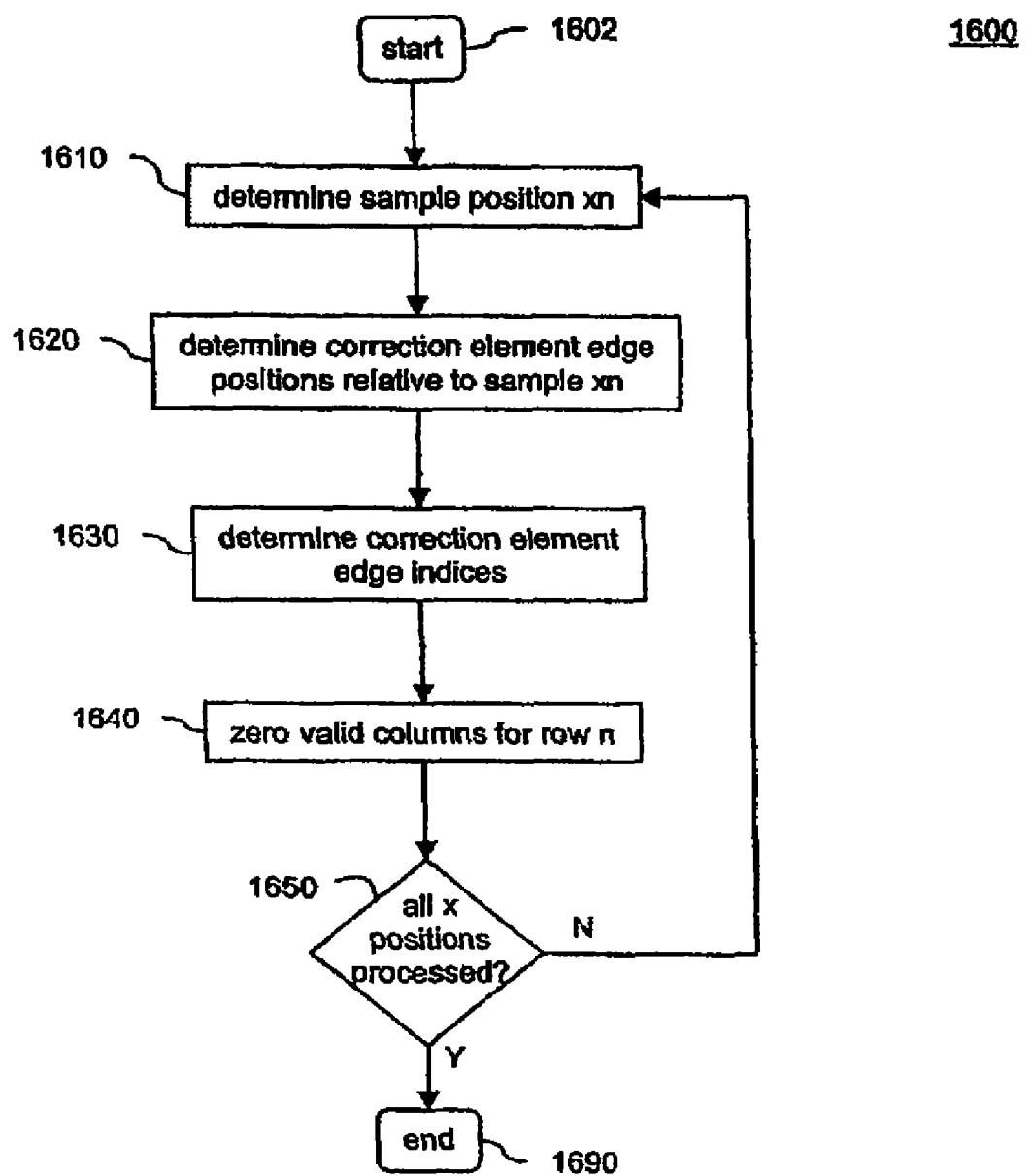

FIG. 16 depicts a flowchart of a method for determining the transmission mask at x-shadow position $x_n$, according to an embodiment of the invention.

Figure 17:
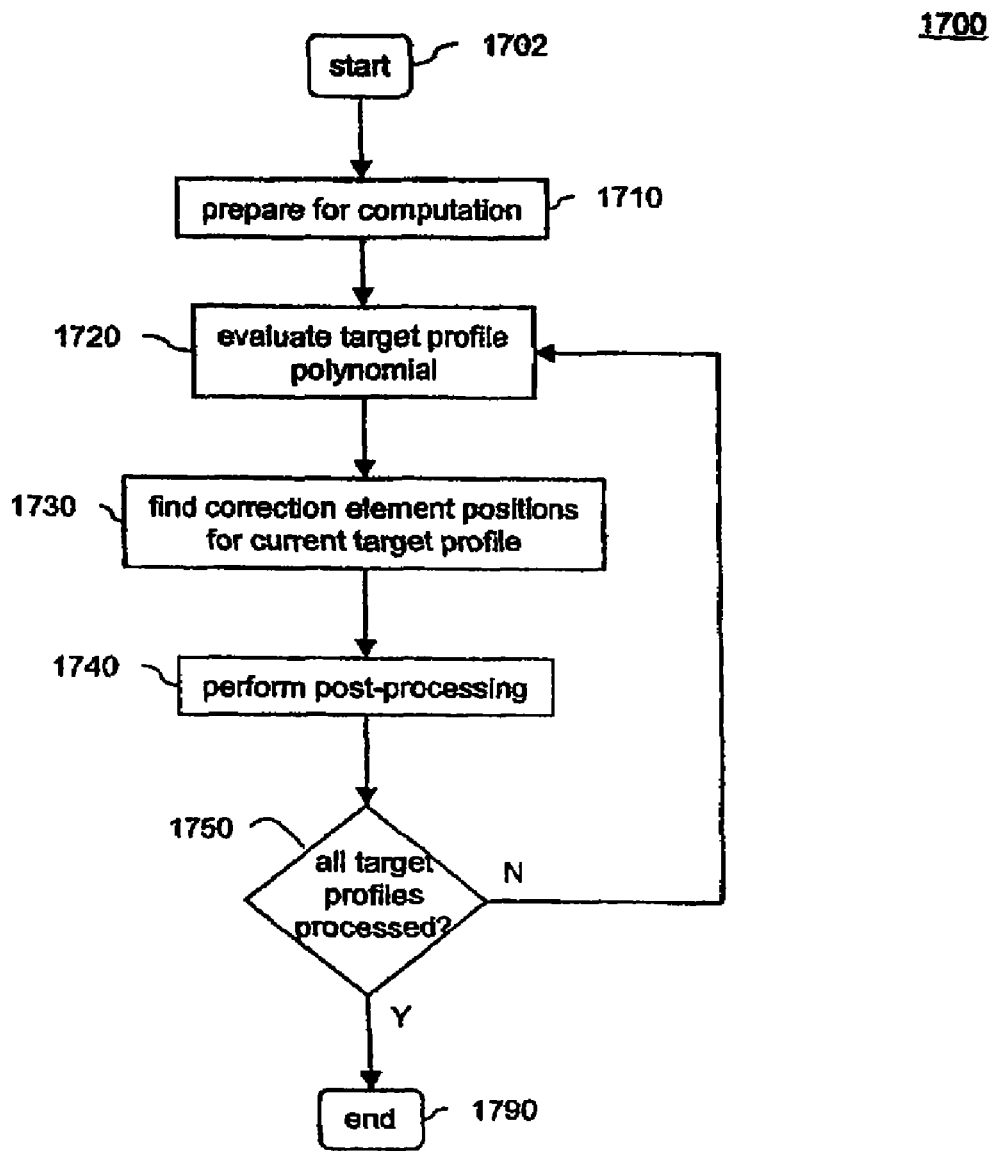

FIG. 17 depicts a flowchart of a method for determining the position of one or more correction elements, according to an embodiment of the invention.

Figure 18:
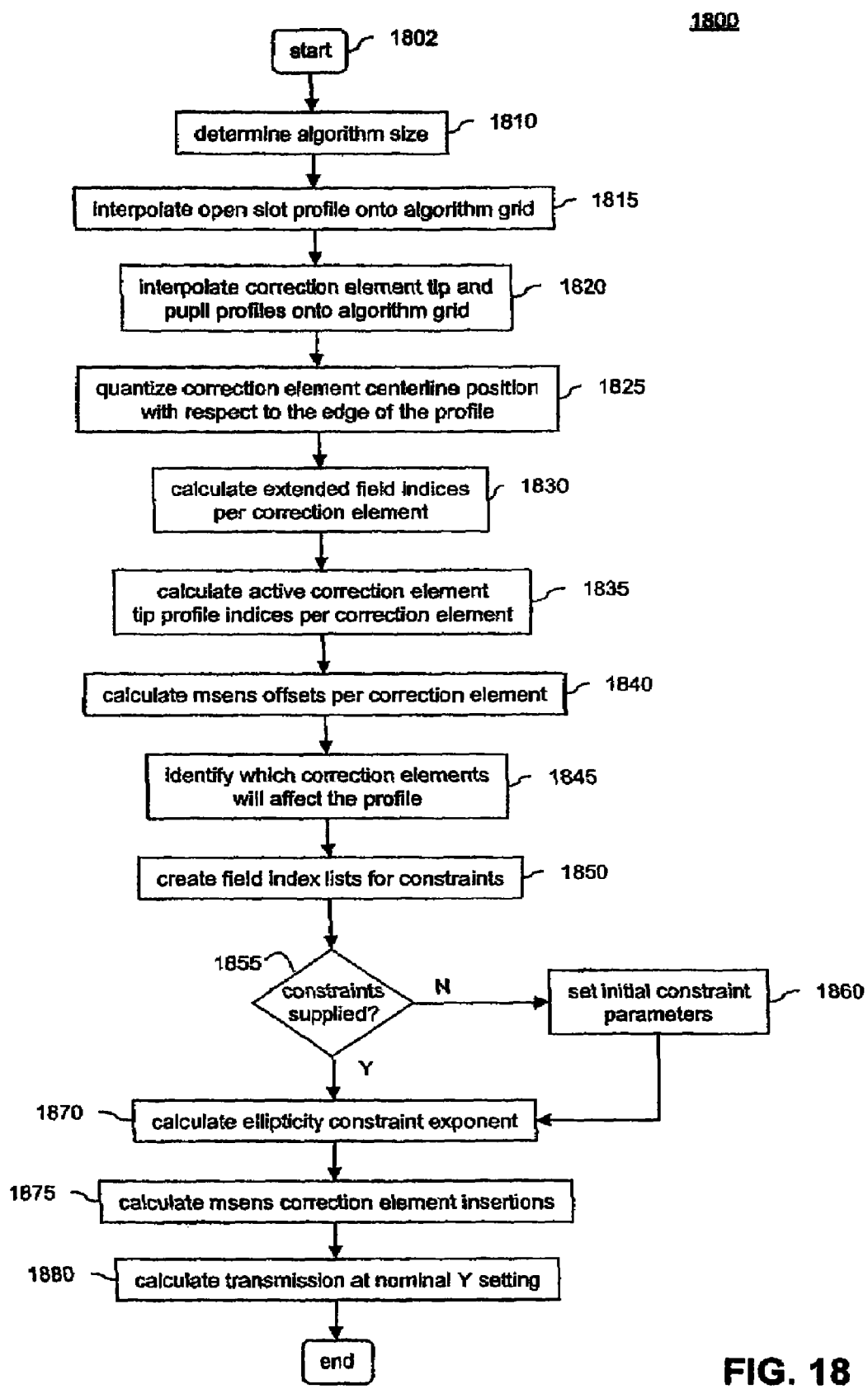

FIG. 18 depicts a flowchart of a method for preparing for computation, according to an embodiment of the invention.

Figure 19:
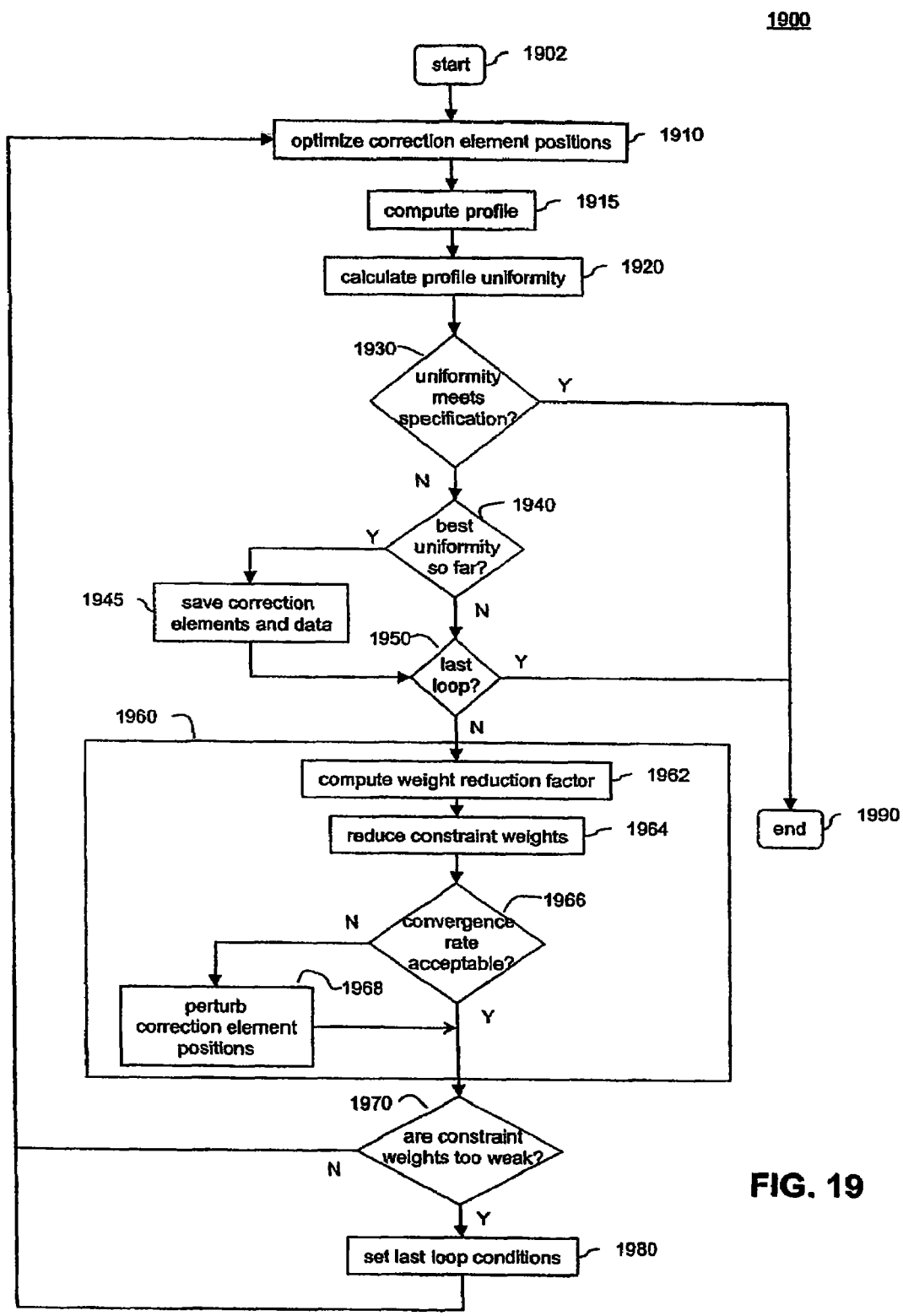

FIG. 19 depicts a flowchart of a method for finding correction element positions for the current target profile, according to an embodiment of the invention.

Figure 20:
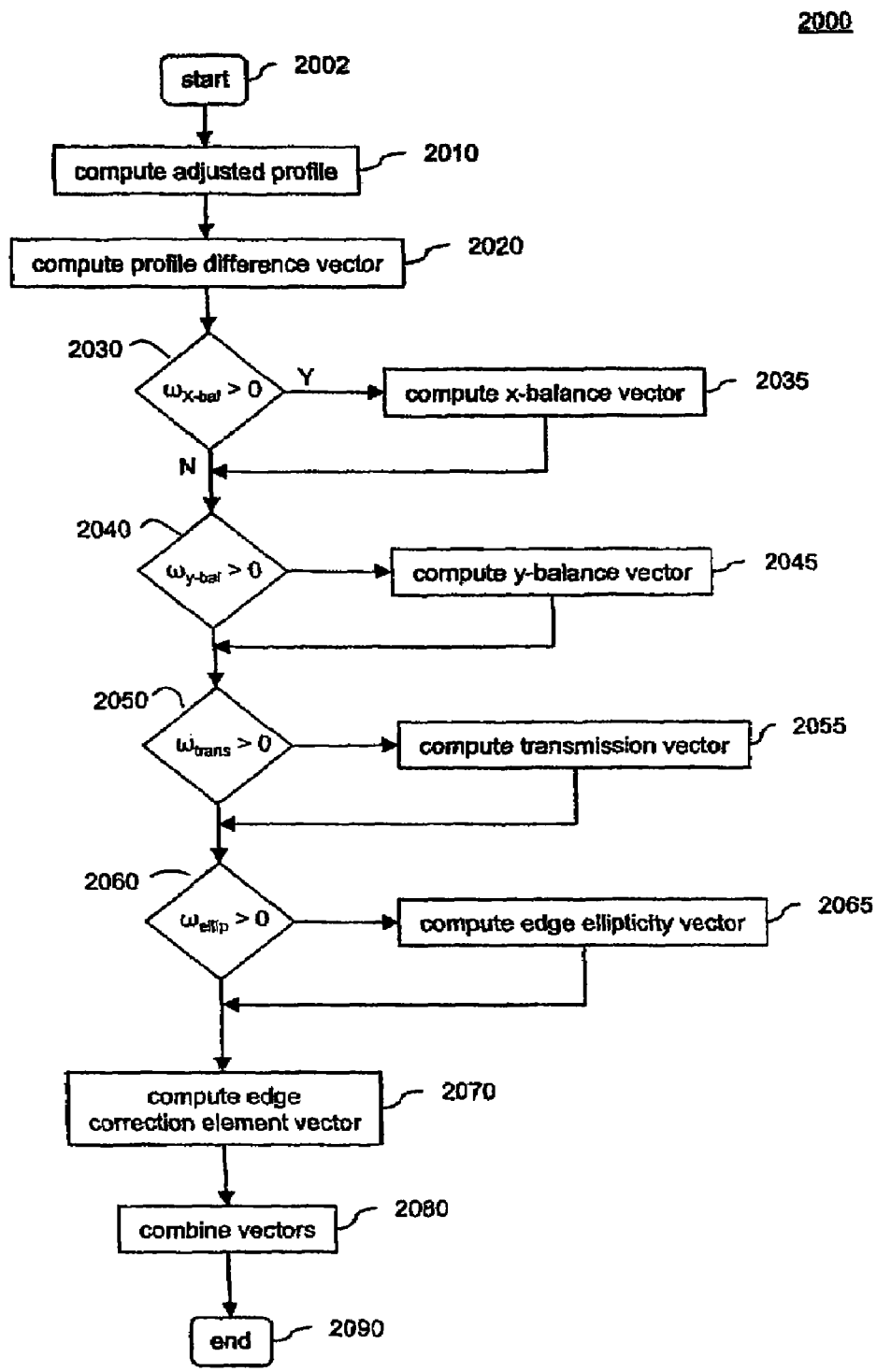

FIG. 20 depicts a flowchart of a method for determining the optimization objective function, according to an embodiment of the invention.

Figure 21:
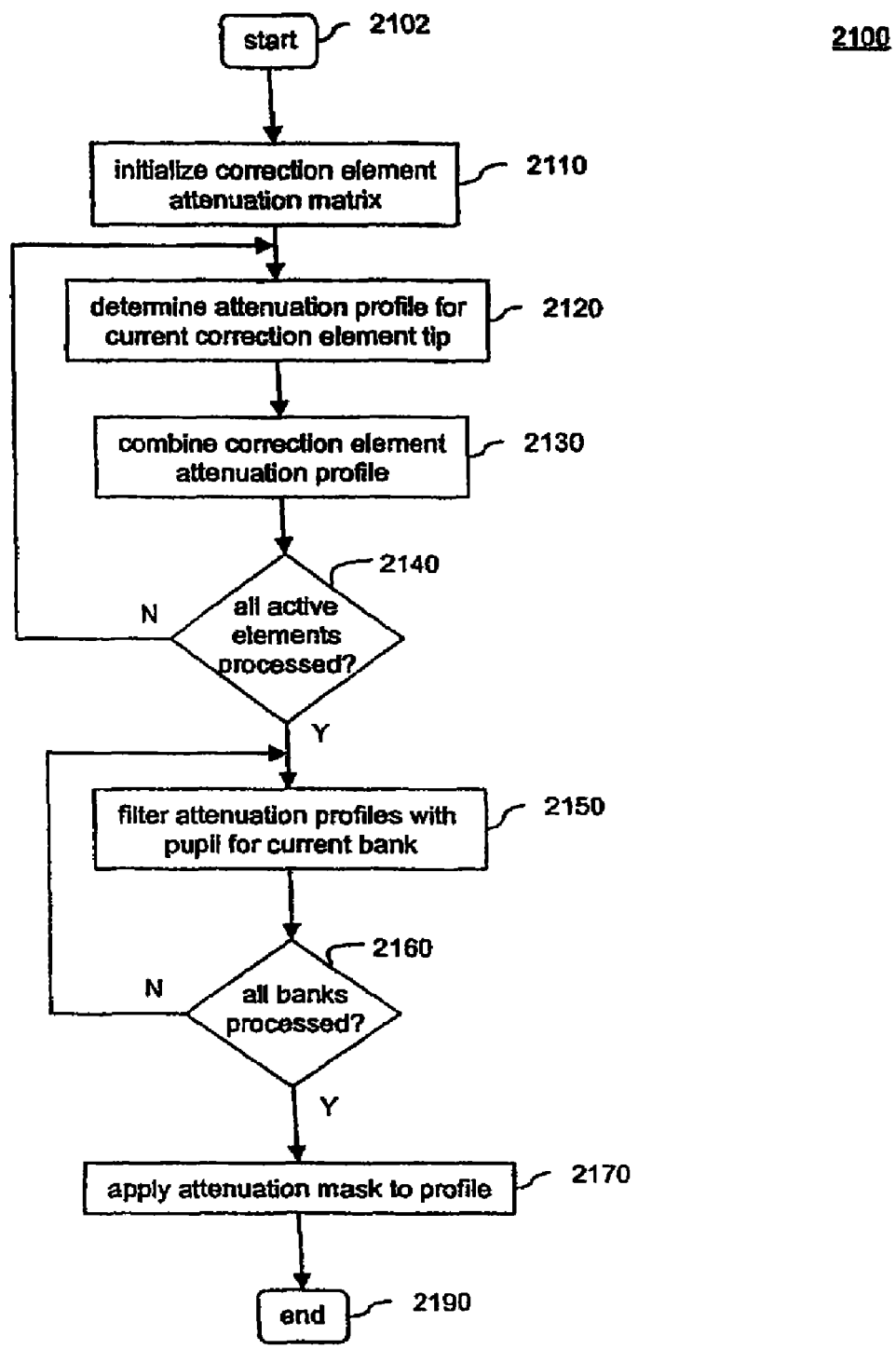

FIG. 21 depicts a flowchart of a method for computing the profile that results from a particular setting of correction element positions, according to an embodiment of the invention.

Figure 22:
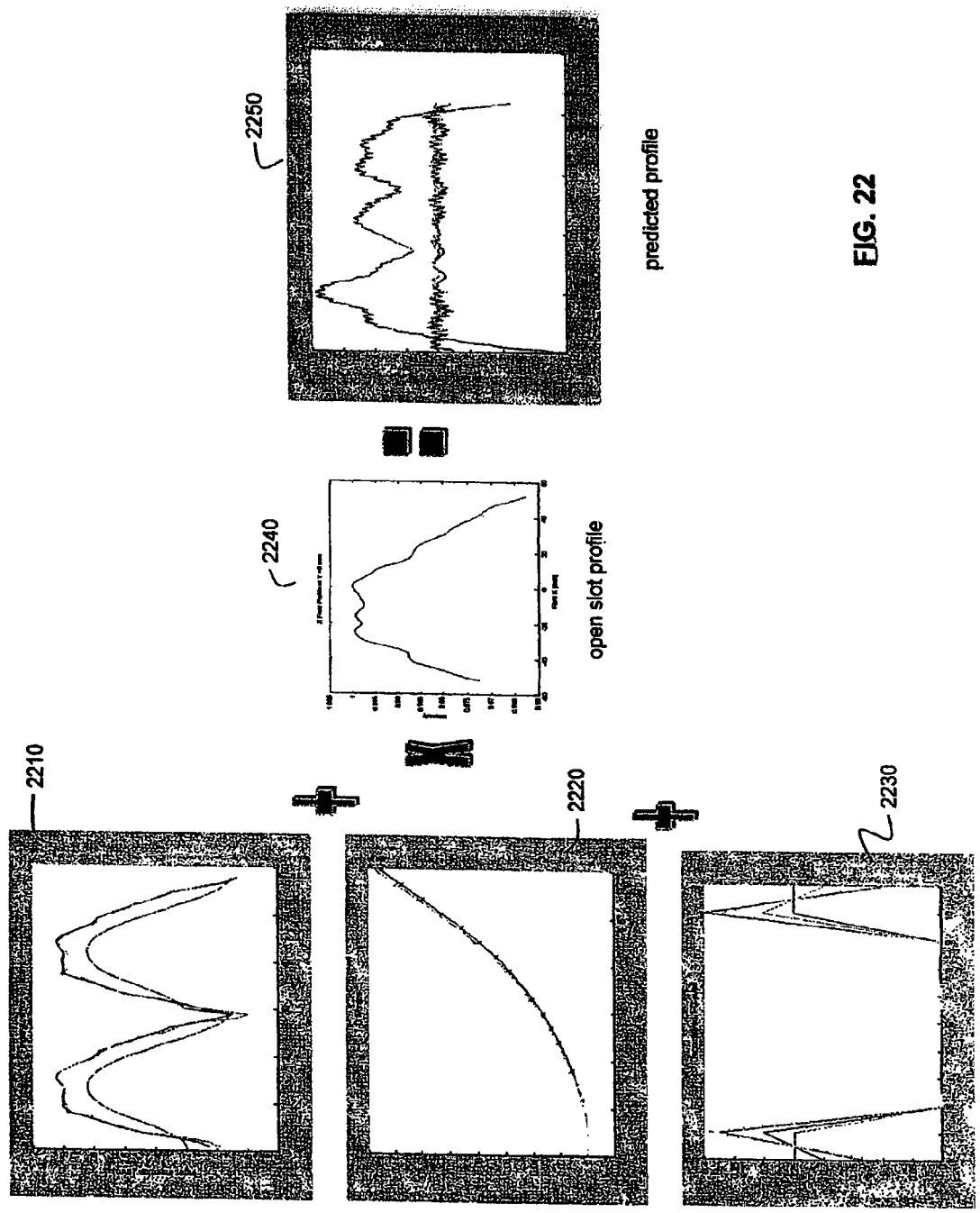

FIG. 22 depicts the optimization function visually.

Figure 23:
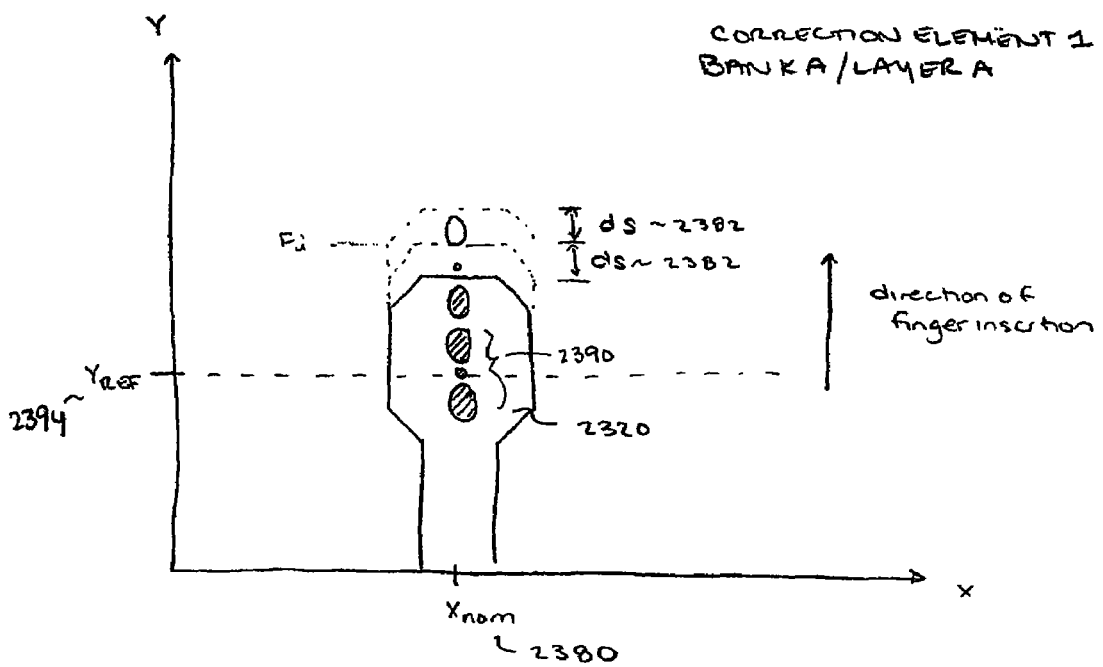

FIG. 23 shows the relationships between pupil, correction finger, and X measurement point for Msens, Y measurement point for x-pupil.

Figure 24:
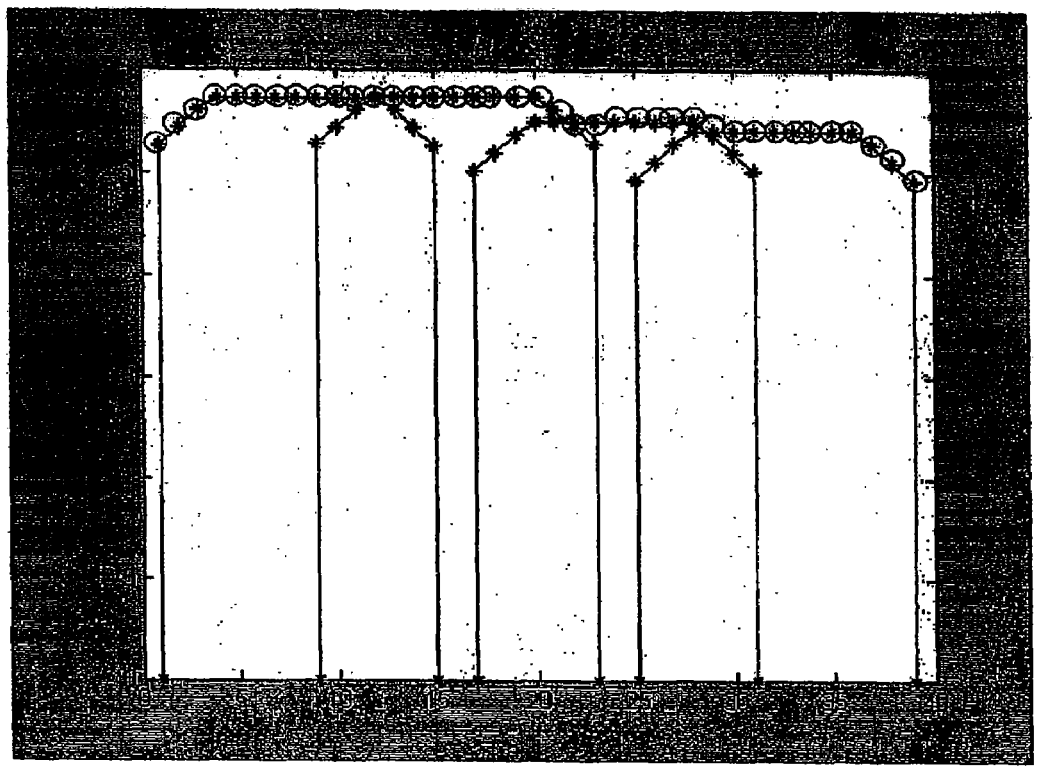

FIG. 24 depicts an exemplary skyline for a portion of one bank of overlapping correction elements, according to an embodiment of the present invention.

Figure 25:
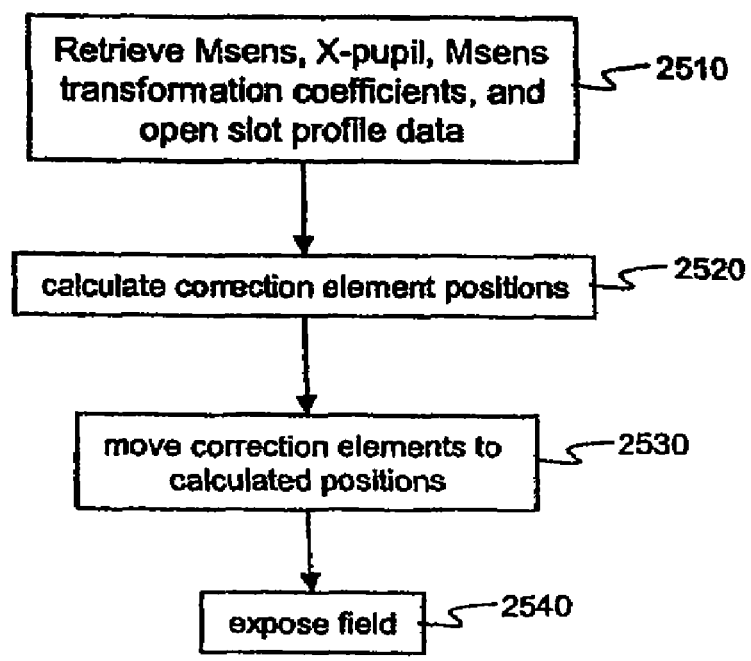

FIG. 25 depicts a flowchart 2500 of a method for uniformity correction to induce a non-flat profile, according to an embodiment of the invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

1. Overview

The present invention is directed to a system and method for advanced uniformity correction. In accordance with an aspect of the present invention, the uniformity correction system includes a first plurality of winged correction elements inserted into the illumination field from a first longitudinal edge of the correction slit and a second plurality of winged correction elements inserted into the illumination field from a second longitudinal edge of the correction slit. The first and second plurality of winged correction elements are staggered. In accordance with another aspect of the invention, the first and second plurality of winged correction elements are directly opposed.

Each winged correction element has a first protrusion on a first longitudinal edge of the correction element and a second protrusion on the second longitudinal edge. In accordance with an aspect of the invention, the first protrusion has a first shape and the second protrusion has a second shape. The first protrusion has an outer edge parallel to the direction of insertion of the correction element and a sloped edge between the outer edge and a flat tip of the correction element. The second protrusion has an outer edge parallel to the direction of the insertion of the correction element and a sloped edge between the outer edge of the second trapezoid and a flat tip of the correction element. The slope of the sloped edge of the first protrusion and the slope of the sloped edge of the second protrusion are related to the slope of the maximum gradient of the scan-integrated intensity of the illumination field. In accordance with another aspect of the invention, the angles defined by the flat tip of the correction element and the sloped edge of the first and second protrusions are related to the angle of the maximum gradient of the scan-integrated intensity profile.

In accordance with an aspect of the invention, a method for correcting uniformity includes identifying a parameter of an illumination field being used in the lithography system such as gradient in the non-uniformity profile of the illumination field. The configuration for the plurality of winged correction elements is then determined. The winged correction elements are then inserted into the illumination field according to the determined configuration.

2. Uniformity Correction System 2.1 Overview

Figure 1:
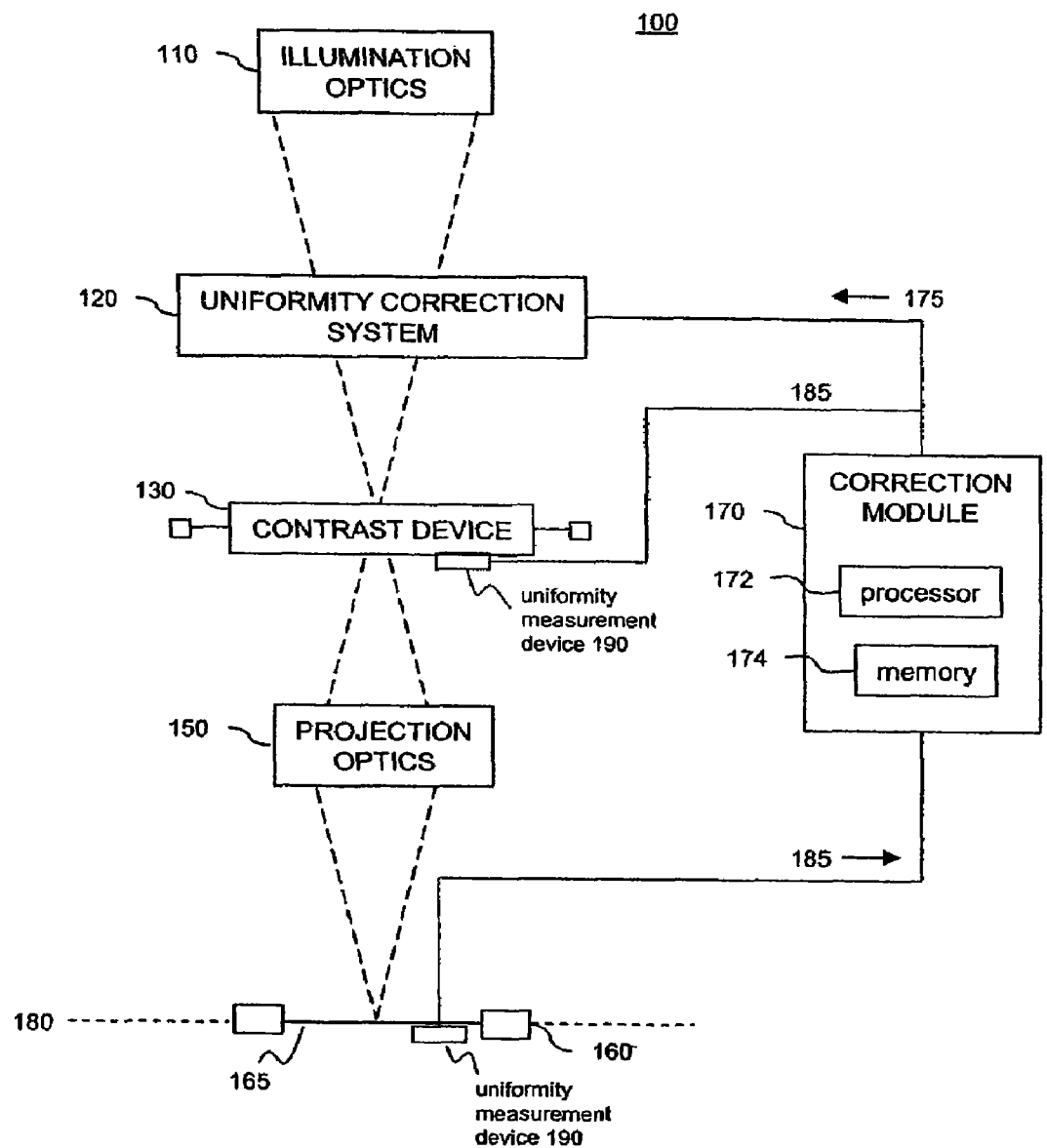
FIG. 1 illustrates an exemplary lithography system having uniformity correction, according to an embodiment of the present invention.

FIG. 1 is an illustration of an exemplary lithography system 100, according to an embodiment of the invention. In an embodiment, lithography system 100 is a system using a reticle or mask. In an alternate embodiment, system 100 is a maskless lithography system.

Lithography system 100 includes an illumination system 110, a uniformity correction system 120, a contrast device 130, projection optics 150, and a substrate stage 160.

Illumination system 110 illuminates contrast device 130. In an embodiment, illumination system 110 defines a field or slit which is scanned across contrast device 130. Illumination system 110 may use any type of illumination (e.g., quadrupole, annular, etc.) as required by the lithography system. In addition, illumination system 110 may support the modification of various illumination properties such as partial coherence or fill geometry. The details of illumination systems are well known to those skilled in the art and thus are not explained further herein.

Contrast device 130 is used to image a pattern onto a portion of a substrate 165 (e.g., wafer or glass plate) held by substrate stage 160. In a first embodiment, contrast device 130 is a static mask such as a reticle and substrate 165 is a wafer. In a second maskless embodiment, contrast device 130 is a programmable array. The programmable array may include a spatial light modulator (SLM) or some other suitable micro-mirror array. Alternatively, the SLM can comprise a reflective or transmissive liquid crystal display (LCD) or a grading light value (GLV). In the second embodiment, substrate 165 may be a piece of glass, flat panel display, or similar.

Projection optics 150 is configured to project an image of the pattern (defined by the contrast device) on the substrate. The details of projection optics 150 are dependent upon the type of lithography system used. Specific functional details of projection optics are well known to those skilled in the art and therefore are not explained further herein.

Substrate stage 160 is located at the image plane 180. Substrate stage 160 supports a substrate 165. In an embodiment, the substrate is a resist coated wafer. In an alternate embodiment, the substrate is a piece of glass, flat panel display, printhead, plastic target, or similar.

Uniformity correction system 120 is a device that controls illumination levels within specific sections of illumination field associated with system 100. The uniformity correction system 120 is positioned between illumination system 110 and contrast device stage 130 at the correction plane. In an embodiment, the correction plane is located proximate to the contrast device stage (e.g., reticle stage). In alternative embodiments, the correction plane can be located at any position between illumination system 110 and contrast device stage 130 (i.e., moving in the z-direction between illumination system and contrast device).

A primary purpose of a uniformity correction system 120 is to improve the uniformity of the illumination produced by illumination system 110. When illumination from illumination system 110 is uncorrected, illumination energy in the slit used for printing may vary. FIG. 2A illustrates an exemplary uncorrected illumination profile 200. As shown in FIG. 2A, a rectangular illumination field or slit 220 is formed. While the illumination field is illustrated as rectangular, other shapes may be used. Waveform 240 illustrates the intensity distribution along the width of the rectangular illumination field 220. While waveform 240 is illustrated as a Gaussian waveform, a person of skill in the art will appreciate that other shapes can be used. Waveform 240 has a non-uniformity 260. Waveform 280 of FIG. 2B illustrates the integral of the uncorrected illumination energy along the width of the rectangular illumination field. Portion 295 of waveform 200 illustrates the reduced illumination energy as a result of the non-uniformity 260.

If lithography system 100 was used without any correction device, non-uniformities such as non-uniformity 260 or other aberrations in the illumination field would cause critical dimension (CD) printing errors or other types of errors. To minimize these errors, the illumination intensity provided to the substrate 165 should be substantially uniform. Modifying performance parameters of illumination system 110 can help improve the uniformity of the illumination field. However, because of the physics of illumination systems, the illumination field cannot be made substantially flat by modifying the performance parameters of the illumination system alone. Therefore, a uniformity correction module 120 is needed between the illumination system and the contrast device to produce scan-integrated illumination that is constant ("uniform") in the cross-scan direction.

Correction module 170 is configured to determine adjustments to the variables of correction system 120 such that the desired uniformity specification is met. Correction module 170 determines one or more correction parameters 175 based on the determined adjustments and communicates these parameters to correction system 120. The correction parameters control adjustable variables within correction system 120. Correction module 170 may also receive illumination field data 185 collected from one or more uniformity measurement devices 190 positioned at the image plane 180 or plane of the contrast device.

Through manipulation of the adjustable variables of correction system 120 in accordance with the correction parameters, characteristics of the illumination beam are changed. More specifically, the correction parameters provide details on how to adjust the variables of correction system 120 to achieve the desired uniformity profile (e.g., flattest uniformity or shape beneficial for the lithography process).

Correction module 170 includes one or more processors 172 and memory 174. One or more processors 172 execute software implementing the operations described in Section 3, below. Memory 174 includes a main memory (e.g., a random access memory (RAM)). In an embodiment, memory 174 also includes a secondary memory. Secondary memory can include, for example, a hard disk drive and/or a removable storage drive.

Computer programs are stored in memory 174. Such computer programs, when executed, enable processor 172 in correction module 170 to perform the features of the present invention, as discussed herein.

In an embodiment, where the method for adjusting elements of uniformity correction system 120 is implemented using software, the software can be stored in a computer program product and loaded into correction module 170 using a removable storage device, a hard drive, or a communications interface. Alternatively, the computer program product can be downloaded to correction module 170 via a communications path.

In addition, in an embodiment, the correction module 170 is coupled to one or more remote processors. The correction module 170 can then receive instructions and/or operating parameters remotely.

2.2 Correction System

Prior uniformity correction systems used one or more filter plates to perform correction. However, the filter plates did not have sufficient degrees of freedom to correct the variety of illumination profiles existing and expected in the next generation of lithography tools. For example, illumination systems are moving away from techniques using rod homgenizers toward systems using field defining element (FDE). FDE illumination systems typically introduce higher ordered errors than those with rod-based designs. In addition, the spatial frequency content of the uniformity profile in FDE systems is more sensitive to illumination type, requiring greater flexibility in correction. Therefore, uniformity correction systems having greater flexibility to correct higher odd order aberrations were developed. In addition, in some prior uniformity correction systems, adjacent correction elements were interlocked. These interlocking configurations caused significant wear on the components under a large number of cycles.

FIG. 3A illustrates an exemplary uniformity correction system 315 having a plurality of rectangular correction elements in a non-staggered configuration. Uniformity correction system 315 includes multiple correction elements 320a-n inserted from side A of correction slot and multiple correction elements 322a-n inserted from side B of the correction slot. Correction elements 320, 322 can be any mechanism that effects uniformity. In an embodiment, multiple correction elements 320, 322 are rectangular plates (also referred to as fingers) constructed of an opaque material. In an alternate embodiment, multiple correction elements 320, 322 are constructed of a transmissive material. Multiple correction elements 320 and 322 are selectively inserted in the illumination field along the length of the illumination slit to correct or make more uniform the illumination energy of the illumination field. Each correction element 320a-n, 330a-n has the ability to move independently of the other correction elements. The correction elements of FIG. 3A correct uniformity by trimming the edge of the illumination field (e.g., cutting out illumination or changing the transmission of the incident illumination). However, because of the shape of the correction elements, certain illumination profiles cannot be fully corrected.

The correction system 315 depicted in FIG. 3A has a non-staggered configuration of correction elements. In a non-staggered configuration, each correction element 320 is directly opposed to a corresponding correction element 322. Thus, correction element 320a is directly opposed to correction element 322a, correction element 320b is directly opposed to correction element 322b, and so on. Directly opposed correction elements are referred to herein as a correction element set. In the example of FIG. 3A, correction elements 320, 322 are inserted into the illumination field in order to correct for a gradient (also referred to as a tilt) in the intensity of the illumination field. Although the following paragraphs describe correcting for a gradient, other types of errors or aberrations can also be corrected using the present invention.

As discussed above, the goal of the configuration in FIG. 3A is to correct for gradient 362 in the intensity of the illumination field. Gradient is represented as a dashed line which extends from a first edge 325 to a second edge 327 of the uniformity correction slit. Thus, the gradient is perpendicular to the direction of insertion of the correction element. Gradients that are in the direction of correction element insertion are considered to be non-uniformities in the scan-integrated illumination profile. Although FIG. 3B illustrates the intensity gradient as a straight line, the intensity gradient may have other shapes (e.g., curved). Also, note that FIG. 3B illustrates the resulting field if the uniformity correction system was located at a focus plane (e.g., plane at which pupil is infinitely small). As would be appreciated by persons of skill in the art, the uniformity correction system can be located at a de-focus position.

In order to correct for the intensity gradient, correction waveform 364 must closely approximate gradient 362. If uniformity correction system 315 had a very large number of correction elements, the correction element could be inserted in a pattern to generate a waveform 364 matching each one of the data points on gradient 362. This configuration would be able to fully correct for the gradient. However, in practicality, only a finite number of correction elements, having a finite width, are available to perform the correction. While some level of correction is provided, the size and shape of the correction elements and also in the scan-integrated pupils induce residual errors (e.g., ripple) in the scan-integrated pupil uniformity.

FIG. 3B illustrates an exemplary residual error generated by the correction element configuration used in FIG. 3A. FIG. 3B depicts the error as a function of the integrated intensity of the illumination and position in the illumination slit. As shown in FIG. 3B, when transitioning from correction element set 320a, 322a to correction element set 320b, 322b, a step occurs in correction waveform 364. In general, correction waveform 364 represents the degree of insertion of the correction element combined with the intensity profile. For ease of description, FIG. 3B assumes a flat uniform intensity profile over the field. However, the invention is not limited to use with flat uniform fields. As would be appreciated by persons of skill in the art, the present invention can also be used with non-flat and non-uniform illumination fields.

Steps are created in correction waveform 364 for each transition from one correction element set to the next correction element set. Therefore, waveform 364 represents the best correction that can be achieved with the configuration of uniformity correction system 320 for gradient 362. Because of finite nature of the correction elements, a uniformity ripple is induced. The uniformity ripple is the difference between waveform 364 and gradient 362. For example, at slit position 0, the ripple is positive, at 2 mm the ripple goes to 0 and at 4 mm the ripple goes negative. This ripple pattern continues across the illumination slit. The worst case magnitude of the ripple, referred to herein as the maximum ripple, is the maximum difference between gradient 362 and the worst point on correction waveform 364. Furthermore, the location of the uniformity correction system contributes to the ripple. The worst case, as illustrated in FIG. 3B, is when there is zero defocus. As the uniformity correction system is pulled out of focus, ripple is reduced.

Gradient is defined as the rise in the scan-integrated intensity that occurs over the width of one or more correction element. The slope or shape of the gradient can change on a correction element by element basis or span multiple correction elements. The gradient can be a straight line or curved. Because the gradient is defined by the width of one or more correction elements, it is dimensionless. Because maximum ripple can be expressed as a function of the gradient, the maximum ripple is known regardless of the size of the correction element. In the example of FIGS. 3A and 3B, the maximum ripple induced by configuration 320 is equal to the gradient divided by two.

FIG. 4A illustrates an exemplary portion of a correction system 415 having staggered configuration of correction elements. As shown in FIGS. 4A and 4B, an improvement can be achieved by staggering the insertion of opposing correction elements 420 and 422. In a staggered configuration, correction elements are shifted so that they are no longer directly opposed. The staggered configuration creates multiple zones 430A-E defined by the edges of the correction elements. For example, the left edge of correction element 422a and the right edge of correction element 420a define zone 430A; the left edge of correction element 420b and the right edge of correction element 422b define zone 430B; the left edge of correction element 422b and the right edge of correction element 420b define zone 430C; and so on. Because the correction elements are rectangular, the shape of zones 430A-E are also rectangular.

FIG. 4B illustrates an exemplary residual error generated by the correction element configuration used in exemplary correction system 415. Also, not that FIG. 4B assumes zero de-focus. As can be seen in FIG. 4A, the width of each correction element encompasses two zones 430. Because the steps in scan-integrated intensity of waveform 464 occur at the edge of corrections elements, two steps are then used to approximate the gradient across a correction element. By staggering the correction elements, the step at each edge in FIG. 4B is reduced by one-half of the step in FIG. 3B for the same gradient. As a result, the maximum ripple is also reduced by a factor of two without increasing the total number of correction elements required. In the example of FIGS. 4A and 4B, the maximum ripple equals the gradient divided by four.

FIG. 5 depicts an exemplary titled configuration of rectangular correction elements. In this configuration, multiple correction elements 526a-n are inserted from side A of the illumination slot at an angle a with respect to the scan direction (or Y-axis). Multiple correction elements 526m-z are inserted from the opposite side (side B) of the illumination slot at an angle-α with respect to the scan direction (or Y-axis). In an embodiment, the maximum insertion of correction elements 526a-n and 526m-z is to a neutral point. That is, each correction element can be inserted any amount up to a point at which the tip of a correction element 526a-n is proximate to the tip of a correction element 526m-z. In this embodiment, correction elements 526a-n do not overlap correction elements 526m-z.

FIG. 6 depicts an exemplary chevron configuration of correction elements. In this configuration, multiple correction elements 626a-n are inserted from side A of the illumination slot at an angle α with respect to the scan direction (or Y-axis). Multiple correction elements 626m-z are inserted from the opposite side (side B) of the illumination slot at the same angle, α, with respect to the scan direction (or Y-axis). In this configuration, correction elements 626a-n and 626m-z can be inserted to a depth such that correction elements overlap. In this embodiment, each correction element can be inserted any amount up to a maximum insertion point.

In an embodiment of the present invention, a non-rectangular shape is used for the portion of the correction element inserted in to the illumination field. FIG. 7A illustrates an exemplary portion of a uniformity correction system having a staggered configuration of winged correction elements 720a-c, 722a-c, according to an embodiment of the present invention.

FIG. 8 illustrates an exemplary winged correction element 840 that can be used as one or more of the winged correction elements 720a-c and/or 722a-c, according to an embodiment of the present invention. Correction element 840 includes a rectangular portion 841, a first wing portion 842a, and a second wing portion 842b. Thus, the upper section 860 of the correction element has a protrusion on each longitudinal side of the correction element, giving the correction element a paddle-like shape. A portion of the upper section 860 of the correction element 840 is configured to be inserted into the illumination field. As can be seen in FIG. 8, the width of lower section 865 of the correction element is substantially narrower than the width 848 of the winged upper section of the correction element. The end 868 of the correction element is coupled to a mechanism in the uniformity correction system for varying the degree of insertion of the element into the illumination field.

The flat tip 870 of the correction element has a width 846, which is substantially the same as the width of the lower section 865 of the correction element. The width 848 of the correction element is the width from the outer edge of first wing portion 842a to the outer edge of second wing portion 842b. The width 848 can be set to any value within the limitations of a particular application. The slope 852a and angle 853a of the upper edge of first wing portion 842a and the slope 852b and angle 853b of the upper edge of second wing portion 842b are determined such that improvements in uniformity of the illumination field are optimized. For example, the slopes 852a, 852b and/or angles 853a, 853b can be related to the slope and/or angle of the maximum gradient of the scan-integrated intensity of the illumination field to be corrected. Alternatively, the slope can be related to any gradient, as required by a particular application.

The length of the outer edge 844 of each wing portion 842a, 842b is determined based on the maximum depth that the correction element can be inserted into the illumination field. This length is sometimes referred to as the maximum stroke of the correction element. The lower edges 854a, 854b of the first and second wing portion do not contribute to correction and thus can have any shape or slope.

In an embodiment, first wing portion 842a and second wing portion 842b have a trapezoidal shape. In alternate embodiments, first wing portion 842a and second wing portion 842b can have any shape. In an embodiment, first wing portion 842a and second wing portion 842b are mirror images of each other. In alternate embodiments, first wing portion 842a can have a different shape than second wing portion 842b.

FIG. 7A illustrates a uniformity correction system 715 having an exemplary staggered configuration of winged correction elements, according to an embodiment of the present invention. Correction element 720a is inserted farther into the illumination slit than correction element 720b. This causes a wing portion of the element 720a to overlap the flat tip of element 720b. As can be seen in FIG. 7A, the transition from the flat tip of correction element 720a to the flat tip of correction element 720b is no longer a step but a ramp having a slope equal to the slope of the upper edge of the wing portion of correction element 720a. In an embodiment, the correction elements are overlapped so that the outer edges 844a, 844b of wing portions 842a, 842b of each correction element inserted into the illumination field are covered by an adjacent correction element. If an outer edge is not overlapped, additional uniformity ripple is induced. For some applications, it may be desirable to introduce some ripple. In these applications, the slope of the upper edges 852a, 852b of the wing portions may be increased to cause a portion of the outer wing edges to be uncovered for specific element insertion configurations.

The staggered configuration of the winged correction elements creates multiple zones 730a-h. Corner 725a of correction element 720a and the first non-overlapped point 727b of correction element 720b define zone 730a; the first non-overlapped point 727b of correction element 720b and corner 729a of correction element 722a define zone 730b; corner 729a of correction element 722a and the first non-overlapped point 731b of correction element 722b define zone 730c; the first non-overlapped point 731b of correction element 722b and corner 725b of correction element 720b define zone 730d; corner 725b or correction element 720b and the first non-overlapped point 727c of correction element 720c define zone 730e; and so on. In this configuration, zones 730a, 730c, 730e, and 730g have trapezoidal shapes and zones 730b, 730d, 730f, and 730h have rectangular shapes.

The overlapping configuration of adjacent correction elements has a number of additional benefits. The overlap prohibits light leakage between correction elements inherent in non-overlapping systems such as described above. The overlap also reduces pupil variation in the scan-integrated pupil in the cross-scan direction. In addition, the individually moving correction elements as opposed to interlocking correction elements, allows for a large number of cycles without wear.

FIG. 7B illustrates the exemplary residual error generated by the correction element configuration used in exemplary correction system 715 having winged correction elements, according to an embodiment of the present invention. Note that FIG. 7B assumes no defocus. As would be appreciated by persons of skill in the art, the uniformity correction system can be located at a defocus position. As can be seen in FIG. 7B, the width of each correction element encompasses eight zones 730. Furthermore, the steps between the flat portions the integrated intensity (as shown in FIGS. 3A and 4A) are now ramps. Thus, the gradient across a single correction element (e.g., element 722b) is approximated by four ramp segments and four flat segments instead of two steps as in FIG. 4B or one step as in FIG. 3B. As can be seen in FIG. 4B, the ramp segments cut the step of FIG. 3B in half. As a result of the four ramp segments, the maximum ripple is reduced by a factor of four from the configuration of FIG. 3A. Thus, for the exemplary configuration of FIG. 7A, the maximum ripple equals the gradient divided by sixteen. Furthermore, as shown in FIG. 7B, staggered winged correction elements provide a closer approximation (as shown by waveform 764) to gradient 762. In embodiments with defocus, the ripple is reduced and the approximation is even closer.

Although FIGS. 7A and 7B describe the use of winged correction elements in a staggered configuration, the winged correction elements can also be used in a non-staggered configuration but with less performance benefits.

Figure 9A:
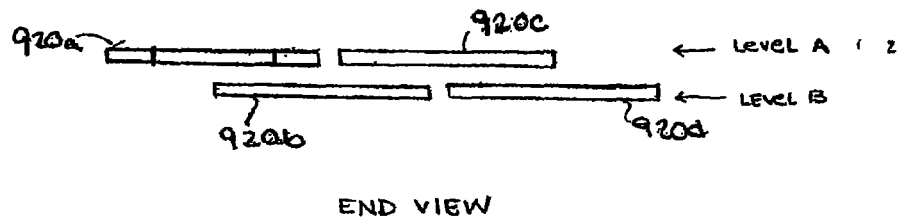
Figure 9B:
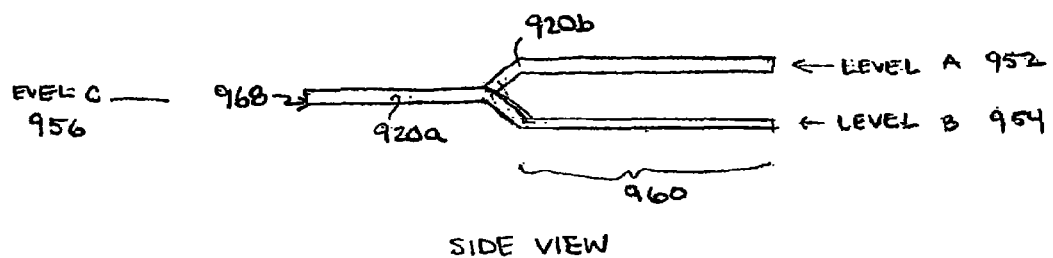
Figure 9C:
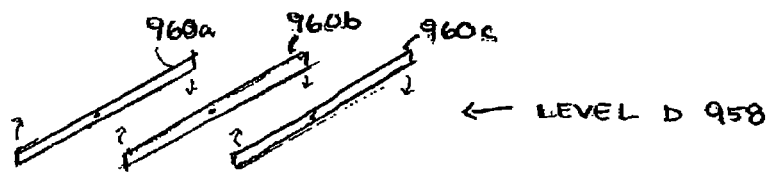

Because the optimal correction is achieved by overlapping correction elements, adjacent correction elements must be inserted at varying levels into the illumination slit. FIGS. 9A through 9C depict exemplary configurations of correction elements in a uniformity correction system, according to embodiments of the present invention. FIG. 9A illustrates an end view of a portion of a uniformity correction system. In FIG. 9A, alternating correction elements are at different heights. For example, correction elements 920a and 920c are inserted into the illumination slit at level A 952. Correction elements 920b and 920d are inserted into the illumination slit at level B 954. In an embodiment, the correction elements are flat (e.g., are not bent). Depending on the width of the correction elements and the extend of overlap required, more than two heights for insertion may be used.

FIG. 9B illustrates a side view of a portion of an exemplary uniformity correction system in which the correction elements are bent to allow for overlap of adjacent correction elements. In FIG. 9B, the lower section of each correction element is located at level C 956. The end 968 of each correction element is coupled to a mechanism for varying the degree of insertion for each correction element. Alternating correction elements are then bent up or down to different levels. For example, a first correction element (e.g., correction element 920a) is bent such that the upper section 960 is at a level B 954. The adjacent correction element (e.g., correction element 920b) is bent such that the upper portion is at a level A 952. This pattern is repeated for each element in the correction system. Depending on the width of the correction elements and the extend of overlap required, more than two levels for insertion may be used.

FIG. 9C illustrates an end view of a portion of an exemplary uniformity correction system in which the correction elements are louvered to allow for overlap of adjacent correction elements, according to an embodiment of the present invention. In FIG. 9C, the center points 968 of the correction elements are located at height D 958. To achieve overlap, the correction elements are inserted at an angle. A mechanism can be coupled to each correction element to rotate the correction element. In an embodiment, each correction element is inserted at the same angle. In an alternate embodiment, multiple angles could be used. In an embodiment, the angles are variable, based on the needs of a particular application.

Figure 9D:
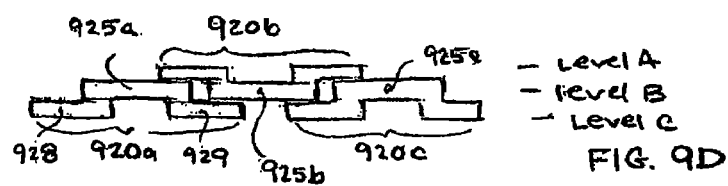

FIG. 9D illustrates an end view of a portion of an exemplary uniformity correction system in which the correction elements are bent such that the tips of adjacent correction elements are at the same level, according to an embodiment of the present invention. In FIG. 9D, the tips 725a-c of correction elements 720a-c are at level B. The winged portions 728 are bent. For example, correction element 720a is bent such that the winged portions 728 are located at level C. Correction element 720b is bent such that the winged portions 728 are located at level A. This pattern is repeated for the correction elements in a Bank.

As would be appreciated by persons of skill in the art, other configurations to allow for overlap of adjacent winged correction elements can be used with the present invention.

Prior uniformity correction systems such as those depicted in FIGS. 3A and 4A compensated for uniformity ripples by moving the location of the correction plane (e.g., move correction system in or out in the z-direction) depending on the illumination mode being used. As a result, scan-integrated intensity uniformity errors increased. A uniformity correction system having overlapping winged correction elements reduces the need to move the uniformity correction system to adjust for ripples due to different illumination modes. The uniformity correction system having overlapping winged correction elements also allows the uniformity correction system to operate closer to the focus plane, reducing variations in the pupil effects.

FIGS. 10A through 10C illustrate the use of a uniformity correction system having staggered winged correction elements to correct for a range of gradients, according to an embodiment of the present invention. Multiple correction element positions in a staggered winged uniformity correction system (such as shown in FIGS. 10A-10C) produce no uniformity ripple for illumination profiles that are flat in the scan direction. FIG. 10A depicts a configuration to correct for a zero gradient situation. In this configuration, correction elements 1020a-e are inserted in the slit substantially the same amount and correction elements 1022a-e are inserted in the opposite side of the slit substantially the same amount. For the zero gradient configuration, no ripple is induced for any pupil fill.

As the gradient being corrected increases, the uniformity ripple also begins to increase. The ripple increases until the maximum ripple case is reached. In an embodiment, the worst case of uniformity ripple occurs for the gradient midway between zero gradient and the maximum gradient. FIG. 10B depicts a configuration to correct for a gradient midway between the zero gradient and the maximum gradient. The insertion required to correct for this gradient introduces a very low uniformity ripple.

As the gradient being corrected continues to increase past the midway gradient, the uniformity ripple decreases until it reaches zero. A zero ripple is again achieved when the maximum gradient is being corrected. FIG. 10C depicts a configuration to correct for the maximum gradient. As shown in FIG. 10C, the correction elements are inserted to a position approximating the maximum gradient. In this configuration, each zone has a trapezoidal shape. If every other zone is flipped, a straight line and a trapezoid is produced. This straight line substantially approximates the maximum gradient and thus, the configuration produces no uniformity ripple.

3. Method for Uniformity Correction

FIG. 11 depicts a flowchart 1100 of a method for uniformity correction for a uniformity correction system having multiple levels of correction elements, according to an embodiment of the invention. Flowchart 1100 is described with continued reference to the exemplary embodiments depicted in FIGS. 7-10. However, the invention is not limited to those embodiments. Note that some steps shown in flowchart 1100 do not necessarily have to occur in the order shown.

Flowchart 1100 is typically performed during set-up of the lithography system for use. In an embodiment, flowchart 1100 is repeated for one or more illumination types supported by the system (e.g., annular, quadrupole, conventional, or dipole).

Flowchart 1100 begins in step 1101 when the uniformity correction per setting procedure is initiated. In an embodiment, the procedure is called during calibration of the lithography tool. In a separate embodiment, the procedure is called during a recipe download.

In step 1102, a determination is made whether existing parameters are to be used during the present calibration. If existing parameters are to be used, operation proceeds to step 1110. If existing parameters are not to be used, operation proceeds to step 1104.

In an embodiment, parameters include correction element positions, and the Msens and X-pupil parameters. Msens is a parameter which indicates the sensitivity of the uniformity profile to insertion of a correction element. Msens represents the response of the uniformity profile to the insertion of a correction element deeper and deeper into the illumination field. In an embodiment, Msens is a matrix. In another embodiment, Msens is represented by a curve.

X-pupil represents the influence of the interaction of correction element geometry and geometry of the illumination on the intensity.

In step 1110, the parameters are retrieved.

In step 1112, a determination is made whether the parameters have been successfully retrieved. If the parameters were successfully retrieved, operation proceeds to step 1160. If the parameters were not successfully retrieved, operation proceeds to step 1104.

In step 1104, a computation of the initial positions for the correction elements is performed and the correction elements are moved to the computed initial positions. In an embodiment, the initial positions represent the maximum retraction of the correction elements. Step 1104 is optional. Step 1104 is present when the lithography system does not include a mechanical field stop. If the lithography system includes a mechanical stop, step 1104 is not included in method 1100.

In step 1106, the uniformity profile is measured. In an embodiment, the correction elements are pulled out (retracted) as far as possible for the uniformity correction system being used. If step 1104 is performed, the correction elements are pulled out to the point determined in step 1104. The profile measured without the correction elements inserted into the field is referred to herein as the "open slot" profile.

In an embodiment, the profile is measured using a spot sensor at the wafer or reticle plane. Alternatively, a charge coupled device (CCD) sensor is used. As would be appreciated by persons of ordinary skill in the art, other measurement techniques could be used with the present invention.

In step 1108, the Msens transformation coefficients are computed. Step 1108 is optional. The transformation coefficients represent additional adjustments to Msens. In an embodiment, adjustments to Msens are desirable to account for certain variations or illumination conditions. For example, because there are likely to be misalignments of the illumination beam and variations within the beam, in an embodiment, the slopes of the Y profile are measured in step 1106. This information is used to determine adjustments to Msens as a function of X position in the illumination field. In another example, adjustments may be made to account for field shift and/or field rotation.

In step 1120, a determination is made whether the measured profile is within the open-slot specification for the lithography tool. Step 1120 is optional. If the measured profile is not within the open-slot specification, operation proceeds to step 1122. If the measured profile is within the open-slot specification, operation proceeds to step 1130.

In step 1122, an indication is provided to the user of the lithography tool that the open-slot uniformity is out of specification. Operation then proceeds to step 1130.

In step 1130, a determination is made whether Msens and X-pupil are to be measured. If Msens and X-pupil are not to be measured, operation proceeds to step 1132. If Msens and X-pupil are to be measured, operation proceeds to step 1140.

In step 1132, a determination is made whether Msens and X-pupil are stored for the current settings. If Msens and X-pupil are not stored for the current settings, operation proceeds to step 1140. In an embodiment, the user of the lithography tool is provided with a message indicating that Msens and X-pupil were not stored for the current settings. If Msens and X-pupil are stored for the current settings, operation proceeds to step 1134.

In step 1134, Msens and X-pupil are retrieved.

Steps 1130-1134 are optional. When present, they provide mechanism for avoiding real-time measurement of Msens and X-pupil, thus, saving time during the calibration procedure In step 1140, Msens is measured. In step 1140, the uniformity response to the insertion of correction elements is characterized. In an embodiment, Msens determination includes two steps. In one step, the transmission change as a function of insertion of a specific correction element is characterized. In an additional step, a correction factor is determined during open slot profile measurement (e.g., using coefficients determined in step 1108). Step 1140 is described in further detail in Section 3.1 below. In an alternate embodiment, Msens is determined by measuring the y-profile of the illumination with the correction elements fully retracted and with the correction elements inserted to a known insertion depth. The measurements are then used to calculate Msens for other insertion depths. In this embodiment, the measurements and calculation are repeated for one or more additional correction elements.

In step 1144, X-pupil is measured for each specified correction element. X-pupil is used to reflect the optical coupling between correction elements in the x-direction. In general, X-pupil is determined by measuring the shadow cast in X at location Y where the pupil is fully obscured by one and only one finger. This location is nominally the midpoint of a fully-inserted correction element. The X-pupil is deconvolved from the shadow measurements using a mask that represents the binary correction element transmission of the pupil's x-profile as a function of field x-position. In an embodiment where the pupil is smaller than the width of the correction element, two edges are available from which to deconvolve a pupil profile. These two profiles are generated and averaged to reduce deconvolution noise. Step 1144 is described in further detail in Section 3.2 below. In an alternate embodiment, X-pupil is determined by measuring a two dimensional image of the pupil and integrating the measurement to produce the X-pupil profile.

In step 1150, correction element positions are calculated. Step 1150 is described in further detail in Section 3.3 below.

In step 1160, the correction elements are moved to the positions determined in step 1150.

In step 1162, the residual profile is measured and residual uniformity is determined. Step 1162 includes steps 1164 through 1168.

In step 1164, the residual profile is measured. The residual profile is the difference between the target profile and the actual measured profile.

In an alternate embodiment, the residual profile and the correction element positions are inputted into a learning algorithm. The learning algorithm determines adjustments to Msens per correction element.

In step 1166, the residual profile is fit to a certain order polynomial. In an embodiment, the residual profile is fit with a Legendre polynomial.

In step 1168, the residual uniformity is determined.

In step 1170, a determination is made whether the residual uniformity is within the convergence limit. If the residual uniformity is within the convergence limits, operation proceeds to step 1180. If the residual uniformity is not within the convergence limit, operation proceeds to step 1172.

In step 1172, a determination is made whether the maximum number of iterations of the correction element position process (steps 1150-1174) has been reached. If the maximum number of iterations has been reached, operation proceeds to step 1180. In an embodiment, a message is generated to inform the user of the lithography tool that the calibration was completed but the uniformity was not within specified limits. If the maximum number of iterations has not been reached, operation proceeds to step 1174.

In step 1174, the residual profile (from step 1166) is added to the modified open slot profile. In the first iteration, the modified open slot profile is the open slot profile measured in step 1106. In subsequent iterations, the modified open slot profile is the modified open slot profile determined in the previous iteration. The result of the addition of step 1174 is the modified open slot profile. Operation then returns to step 1150.

In step 1180, the best correction element positions, modified open slot profile, residual profile, Msens, X-pupil, and Msens transformation coefficients (when generated) are stored.

In step 1190, processing ends.

FIG. 25 depicts a flowchart 2500 of a method for uniformity correction to induce a non-flat profile, according to an embodiment of the invention. Flowchart 2500 is described with continued reference to the exemplary embodiments depicted in FIGS. 7-10. However, the invention is not limited to those embodiments. Note that some steps shown in flowchart 2500 do not necessarily have to occur in the order shown.

In normal operation, the method of FIG. 11 is performed per setting during lithography tool set-up. During operation of the lithography tool, when a setting is selected, a look-up is performed to retrieve the data stored during operation of method 1100 and the uniformity correction system is set according to the retrieved data. The result is a flat profile.

There are cases where a user may wish to induce a non-flat profile to compensate for systematic wafer process variation. In this case, the wafer recipe includes a set of non-flat target profiles that the uniformity correction system must achieve, each assigned to one or more specific fields (die) on the wafer. Flowchart 2500 illustrates an exemplary method for uniformity correction to induce a non-flat profile.

Flowchart 2500 begins in step 2510 when Msens, X-pupil, the Msens transformation coefficients, and the open slot profile data are retrieved. In an embodiment, this information is determined when the method of FIG. 11 is performed during tool set-up.

In step 2520, the correction element positions are calculated. Step 1150 is described in further detail in Section 3.3 below.

In step 2530, the correction elements are moved to the calculated position.

In step 2540, the field is exposed.

3.1 Method for Measuring Msens

FIG. 12 depicts a flowchart of a method 1200 for measuring Msens (step 1140), according to an embodiment of the invention. Msens measurement is performed once for each correction element layer in each bank of the uniformity correction system. For a double-sided, two layer correction system, such as depicted in FIGS. 9A and 9B, Msens calibration is performed twice for each bank of correction elements. Method 1200 is described with continued reference to the exemplary embodiments depicted in FIGS. 7-10 and 23. However, the invention is not limited to those embodiments. Note that some steps shown in flowchart 1200 do not necessarily have to occur in the order shown. Method 1200 begins in step 1202 when Msens measurement is started.

In step 1204, a first bank (side) of correction elements is identified as the measurement bank. For example, bank A of the double-sided uniformity correction system shown in FIG. 7A is selected. The identified bank of correction elements is referred to as the active bank.

In step 1206, a first measurement layer is identified. The identified layer is referred to as the active layer. For example, level A of bank A of the double-sided uniformity correction system shown in FIG. 9A is selected as the active layer.

In step 1208, a correction element from the active bank/active layer is selected as the active correction element for Msens measurement. In an embodiment, during Msens measurement, one correction element from each bank/layer combination is identified as an active correction element. Therefore, for a two layer double-sided uniformity correction system, four active correction elements will be used during Msens measurements.

In addition, in this step, the nominal x-position of the correction element is calculated, according to the following equation. In an embodiment, the nominal x-position is calculated in wafer scale coordinates for consistency.

$$x_{nom} = M_{lens} \cdot \left[\left(\frac{N_j + 1}{2} - n_{j,k}\right) \cdot d_x + R_j + \delta_x\right]$$

$$j \in \{A, B\}, \ k \in \{layer_1, layer_2, \ldots layer_n\}$$

$n_{j,k} \in$ correction element list; represents the number of the active correction element from the correction element list $d_x$=correction element pitch $M_{lens}$=nominal lens magnification $R_j$=correction element offset per bank; determines phase of center relative to the field center in X $\delta_x$=alignment offset x-shift The nominal x-position is used for all line scans until a new calibration correction element is selected. FIG. 23 depicts an exemplary correction element 2320 from bank A/layer A of a uniformity correction system. The nominal x position 2380 is approximately the center of correction element 2320. As would be appreciated by persons of skill in the art, the equation for Xnom could be changed to reflect the relationship between the correction elements and the coordinate system in use.

In step 1210, the correction elements are set to the maximum position and range extension. The measurement of Msens begins with a scan where all correction elements are retracted from the illumination beam. This scan is the reference point against which all subsequent measurements for the active correction element are compared. In an embodiment, the range extension pulls the correction elements out of the illumination beam by an additional amount over what will be permitted during operation of the lithography tool. This extension of correction element travel allows for profile compensation of the Msens function, without having to extrapolate the measured data. For example, if a rotation of the field is detected, the correction element position algorithm will shift the Msens curve by a corresponding amount in order to compensate for the difference in correction element-to-beam geometry as a function of X-location. Without the range extension during calibration, the shifted curves may be evaluated outside the range of measurement, and so, would have to rely on extrapolation.

In an embodiment, the initial position ($F_0$) of all correction elements in both banks is the distance from field y=0 when the correction element is fully retracted ($\phi_{max}$) added to a fraction (e.g., ½) of the allowed extension range beyond ($\phi_{max}$ (½$\phi_{ext}$)) This can be represented by the following equation:

$$F_0 = \phi_{max} + \frac{1}{2}\Delta\phi_{ext}$$

Before the first measurement for the active correction element is taken, all correction elements in the uniformity correction system are set to position $F_0$. In order to correctly measure Msens, the range of correction element insertions used to measure it are determined. This range varies from fully inserted position ($F_{min}$) to the fully retracted position ($F_{max}$). In an embodiment, the range is given by the following equations.

$$F_{max} = F_0$$

$$F_{min} = \phi_{min} - \frac{1}{2}\Delta\phi_{ext}$$

In step 1220, the scan-integrated intensity at the nominal x-position corresponding to the active correction element is measured. The scan-integrated intensity is measured for the active correction element by determining the x-coordinate of the center of the correction element, then performing a line scan in Y across the specified region of the field. Step 1220 is described in further detail below in FIG. 13.

In step 1230, the Msens value for insertion step, i, is computed. In the first iteration of step 1230, the value of insertion step, i, is zero. The value of Msens at each insertion step is the apparent attenuation of the profile for that insertion. The attenuation is calculated, using the scan-integrated intensity (I), determined in step 1220, relative to the situation where the correction element is fully withdrawn from the beam. The attenuation is modeled to reflect what is occurring optically. As a consequence, the value of insertion step i=0 is always zero.

$$Msens_{i,j,k} = 1 - \frac{I_{i,j,k}}{I_{0,j,k}}$$

where insertion i∈{0,1, . . . , $N_{msens}$-1}, $j \in \{A,B\}$, $k \in \{layer_1, layer_2, \ldots, layer_n\}$ In step 1240, a determination is made whether $F_{min}$ was measured. $F_{min}$ represents the difference between the minimum actuation point and the range extension of the system. If $F_{min}$ was measured, operation proceeds to 1250. If $F_{min}$ was not measured proceeds to step 1245.

In step 1245, the measurement layer/measurement bank correction elements are extended by a constant insertion step. In addition, the correction element insertion step variable, i, is incremented in this step. In an embodiment, the insertion step is determined by the following equation:

$$ds = \frac{\varphi_{min} - \varphi_{max} - \Delta\varphi_{ext}}{N_{msens} - 1}$$

$N_{msens}$=total insertion measurements for each correction element The correction element insertion position ($F_i$) for the insertion step is the position of the correction element for all correction elements in the same bank and layer as the active calibration correction element. In an embodiment, the correction element insertion position is defined by the following equation:

$F_i = F_{max} + i \cdot ds$ where insertion
$i \in \{0, 1, \ldots, N_{msens} - 1\}$ Operation then returns to step 1220. FIG. 23 depicts exemplary insertion steps 2382 and their corresponding correction element positions 2384.

Steps 1220-1240 are repeated until $F_{min}$ is measured for the measurement correction element.

In step 1250, a determination is made whether Msens calibration needs to be completed for additional layers of the uniformity correction system within the identified measurement bank. If additional layers remain to be processed, operation proceeds to step 1255. If no additional layers remain, operation proceeds to step 1260.

In step 1255, the next layer is identified as the measurement layer. For example, in the two layer double-sided configuration of FIGS. 5 and 7A, level B is identified as the next measurement layer. Steps 1210-1255 are then repeated for Bank A/level 2. Operation proceeds to step 1210.

Steps 1210-1255 are repeated for each layer in the measurement bank being processed. For example, if the measurement bank includes two layers of correction elements, the loop comprising steps 1210-1255 is performed twice.

In step 1260, a determination is made whether measurements for the second bank/side of correction elements in the uniformity correction system have been completed. If the second bank/side measurements have been completed, operation proceeds to step 1265. If the second bank/side measurements have not been completed, operation proceeds to step 1290.

In step 1265, bank/side B is identified as the measurement bank. Operation then returns to step 1206.

Steps 1206-1265 are repeated for each bank/side of correction elements in the uniformity correction system. For example, if the uniformity correction system includes 2 banks/sides, the loop comprising steps 1206-1265 is performed twice.

In step 1290, Msens calibration processing ends.

FIG. 13 depicts a flowchart 1320 of a method for measuring scan-integrated intensity (step 1220), according to an embodiment of the invention. Flowchart 1320 is repeated for each insertion step for each correction element to be calibrated. Flowchart 1320 is described with continued reference to the exemplary embodiments depicted in FIGS. 5-10. However, the invention is not limited to those embodiments. Note that some steps shown in flowchart 1320 do not necessarily have to occur in the order shown. Flowchart 1320 begins in step 1321 when scan-integrated intensity measurement is started.

In step 1322, a determination is made whether a partial scan is to be performed and whether the current scan is not the initial scan. If both conditions are true, operation proceeds to step 1324. If one or more conditions are not true, operation proceeds to step 1323. Step 1322 is optional. In an embodiment, the same type of line scan is performed for each active correction element.

In step 1323, a full scan is prepared. For the full scan, the scan is over the full depth of the field and is centered at the center of the field, offset by $X_{nom}$.

In step 1324, a partial scan is prepared. For the partial scan, the scan spans the edge of the field to a point in the field (e.g., to the center). In an embodiment, the scan center is dependent upon which bank of correction elements is currently the active bank.

In step 1326, the line scan is performed.

In step 1328, the scan-integrated intensity is computed. The scan integrated intensity is nominally the sum of the intensity measurements in Y. For full scans, the scan-integrated intensity (I) is the sum of the ratio measurements ($\rho$) from the scan performed in step 1326. In an embodiment, the scan-integrated intensity (I) is computed according to the following equation:

$$I_i = \sum_{j=1}^{N_{profile}} \rho_{i,j} \text{ where insertion } i \in \{0.1 \ldots, N_{msens} - 1\}$$

$N_{msens}$=number of total insertion measurements for each correction element $N_{profile}$=profile measurement sample density For partial scans, the integrated intensity for the given insertion is padded with a portion (e.g., half) of the intensity measurements taken in the scan for insertion zero. For simplicity of explanation, let $Y^-$ be the measurement at the most negative Y position in the scan and $Y^+$ be the measurement at the most positive Y position. Also, let $Y^0$ be the sample taken at position Y=0, $Y^{0+}$ be the sample on the positive size of $Y^0$, and $Y^{0-}$ be the sample on the negative size of $Y^0$. For bank/side A, the scan-integrated intensity is given by the following equation:

$$I_i = \sum_{j=Y^0}^{Y^+} \rho_{i,j} + \sum_{j=Y^-}^{Y^{0-}} \rho_{0,j} \quad \text{where insertion } i \in \{0.1...., N_{msens} - 1\}$$

For bank/side B, the scan-integrated intensity is given by the following equation:

$$I_i = \sum_{j=Y^-}^{Y^0} \rho_{i,j} + \sum_{j=Y^{0+}}^{Y^+} \rho_{0,j} \quad \text{where insertion } i \in \{0.1...., N_{msens} - 1\}$$

In other embodiments, $I_i$ is measured directly by the hardware, thereby replacing the equations presented above.

3.2 Method for Measuring X-Pupil

FIG. 14 depicts a flowchart 1400 of a method for measuring X-pupil (step 1144), according to an embodiment of the invention. Flowchart 1400 is described with continued reference to the exemplary embodiments depicted in FIGS. 7-10 and 23. However, the invention is not limited to those embodiments. Note that some steps shown in flowchart 1400 do not necessarily have to occur in the order shown. Flowchart 1400 begins in step 1402 when X-pupil measurement process is started.

The steps in flowchart 1400 are repeated for each active correction element. For example, in the two layer double-sided uniformity correction system depicted in FIGS. 7A and 9A, method 1400 is repeated four times.

In general, for each active correction element, two line scans at a fixed Y location in the field are taken. The line scans are perpendicular to the correction element. One of the line scans is to normalize out the field intensity signature. The second of the line scans is to measure the shadow cast by a correction element. In this scan, the active correction element is fully inserted and the remaining correction elements are retracted. The Y location is chosen to ensure that the pupil will be completely blocked by the correction element when it is fully inserted. In simplest terms, the pupil is the shape of the illumination at the uniformity correction plane. For example, in FIG. 23, y-dipole pupil 2390 is completely blocked by the active correction element. Therefore, $Y_{ref}$ is selected as the Y location for the X-pupil measurement for the correction element. The scan is wide enough to ensure that, initially, the correction element will not block any light from reaching the field. As the scan progresses toward the correction element, more and more light is blocked. As the scan moves away from the finger, less light is blocked. The change in shadow as a function of sample position gives the x-distribution of energy in the pupil.

In step 1410, the correction elements are set to the maximum position ($\Phi_{max}$). The maximum position is the position at which all the correction elements are fully retracted. In an embodiment, all correction elements are set to position, $\Phi_{max}$. Note that unlike $F_{max}$ used in Msens measurement, no range extension is included in $\Phi_{max}$.

In step 1420, a first reference x line scan measurement is performed. As discussed above, this line scan is used to normalize the field intensity signature. This step is optional.

In step 1430, an active correction element is inserted to the minimum position ($\Phi_{min}$). The minimum position is the position at which the active correction element is fully into the beam. During this step, all correction elements in the uniformity correction system are set to position $\Phi_{max}$ except the active correction element which is set to position $\Phi_{min}$.

In step 1440, a second x line scan measurement is performed. The second line scan measurement measures the shadow cast by the correction element.

In step 1450, X-shadow is computed. X-shadow is the transmission function of the correction element. In an embodiment, X-shadow is a vector calculated from the line scan data from the reference scan ($\rho^R$) performed in step 1420 and the shadow scan ($\rho^S$) performed in step 1440. The following equation can be used to compute X-shadow.

$$\tau_{i,j,k} = \frac{\rho_i^S}{\rho_i^R} \quad \text{where sample } i \in \{1, 2, \ldots, N_{shadow}\},$$

$$j \in \{A, B\}, \quad k \in \{\text{odd, even}\}$$

$N_{shadow}$=number of samples in the 1-D shadow measurement.

In step 1460, the 1-D pupil is computed by deconvolution. The 1-D pupil is the x-profile of the pupil. In other words, it is the relative distribution of energy in the pupil as a function of x position at the correction element plane. Step 1460 is described in further detail below in FIG. 15.

In step 1490, X-pupil measurement processing ends.

FIG. 15 depicts a flowchart 1500 of a method for computing the 1-D pupil by deconvolution, according to an embodiment of the invention. Flowchart 1500 is described with continued reference to the exemplary embodiments depicted in FIGS. 7-10. However, the invention is not limited to those embodiments. Note that some steps shown in flowchart 1500 do not necessarily have to occur in the order shown. Flowchart 1500 begins in step 1502 when 1-D pupil computation processing is started.

In step 1504, the quantized pupil width is computed. Based on knowledge of the pupil setting and geometric position of the uniformity correction system, the maximum half-width the pupil profile can have at the correction element plane is determined. The half-width is adjusted to fit the sample grid used in step 1440 for the x-shadow measurement. In an embodiment, the pupil width is assumed to be related tangentially to the epsilon outer ($\mathcal{E}_{outer}$) of the illumination system setting (i.e., the product of the Numerical Aperture (NA) and sigma outer). In an alternate embodiment, the pupil profile may be smaller, for example, if the illumination system setting is Y-dipole.

The width of the determined using the following equation:

$$W_{pupil} = \left(Z + \frac{S_{even} + S_{odd}}{2}\right) \cdot \tan(\arcsin(\varepsilon_{outer}))$$

Z=correction element plane position for current setting $S_k$=optical standoff from filter surface to correction element level The quantized half-width ($\hat{W}$) is calculated based on the number of samples per unit distance in the x-shadow measurement ($N_{shadow}$) done in method 1400. This quantization step puts the pupil profile onto the same grid as the shadow measurements and enables a clean deconvolution.

$$R_{pupil} = \frac{N_{shadow} - 1}{\Delta X_{pupil}}$$

$$\hat{W}_{pupil} = \lceil W_{pupil} \cdot R_{pupil} \rceil / R_{pupil}$$

Δx: length of measurement scan

In step 1506, the transmission mask at x-shadow position is determined. In order to deconvolve the pupil from the shadow measurements, a matrix must be constructed that represents the transmission function of the correction element relative to the pupil at each of the sample points. For each row in the mask matrix, a determination is made which columns correspond to an intersection of the x-pupil profile and the correction element. These columns are set to zero, since the correction element is completely opaque. This process is repeated until the entire mask is defined. Conceptually, each row represents a shift of the pupil profile from −x to +x by one step increments. Therefore, the zero entries in the matrix will shift from right to left from the top row to the bottom row. FIG. 16 describes the sequence of building the x-pupil mask in further detail. As would be appreciated by persons of skill in the art, for embodiments where a plurality of correction elements are partially transmissive, knowledge of the transmission of the correction elements and their arrangement can be used to construct the deconvolution mask.

In step 1510, a determination is made whether any rows contain only zeros. If any rows contain only zeros, operation proceeds to step 1512. If no rows contain only zeros, operation proceeds to step 1520.

In step 1512, submasks are created. If the pupil is smaller than a correction element width, rows will contain only zeros. These rows will correspond to sample points where the pupil is completely blocked by the correction element, producing a complete blockage of light at the image plane. Since these rows contain no information for deconvolution, submasks are created that correspond with the sample points at the transition points, commonly called a knife edge. The knife edge $k_1$ and $k_2$ are the indices of the first and last rows in the mask that are completely zero. The submasks $M_1$ and $M_2$ are then defined as follows. In order to perform the deconvolutions, subarrays $T_1$ and $T_2$ for the x-shadow are required.

$M_1 = M_{n,m}$
$T_1 = \tau_n$
$\forall n \in \{0, 1, \ldots, k_1 - 1\}$
$\forall m \in \{0, 1, \ldots, N_{mask} - 1\}$
$M_2 = M_{n,m}$
$T_2 = \tau_n$
$\forall n \in \{k_2 + 1, \ldots, N_{shadow} - 1\}$
$\forall m \in \{0, 1, \ldots, N_{mask} - 1\}$ In step 1514, the pupil profile is deconvolved from submasks. Ideally, each submask would be a well-conditioned square matrix. The relationship between the pupil profile and x-shadow is given by the linear algebraic relationship is the following equation:

$$M_i \cdot \vec{P}_i = \vec{T}_i, \quad i \in \{1, 2\}$$

Under these ideal conditions, the x-pupil profile results from multiplication of the submask inverse and the shadow subarray.

$$\vec{P}_i = M_i^{-1} \cdot \vec{T}_i, \quad i \in \{1, 2\}$$

More often than not, the submask is not square, so the system of above equation must be solved for $P_i$ in the least squares sense. In an embodiment, Singular Value Decomposition is used to provide numerical stability. As would be appreciated by persons of skill in the art, other methods for solving these systems of linear equations exist and may be equally applicable.

In step 1516, the pupil profiles are combined. Because the pupils are deconvolved from two submasks, two pupil profiles are created. To get a more accurate pupil distribution, the profiles are combined. The method of combining the profiles depends on whether the number of measurement points is odd or even. If even, the profiles are shifted with respect to one another by one pixel. Before combining the profiles, any negative entries are zeroed. In an embodiment, the even/odd combinations are represented by the following equations:

$$\vec{P}_{k,i} = 0 \lor \vec{P}_{k,i} < 0.0, \quad \forall k \in \{A, B\}$$
$$\forall i \in \{0, 1, \ldots, N_{pupil} - 1\}$$

$$\vec{P} = \begin{cases} \begin{bmatrix} \vec{P}_2 \\ 0 \end{bmatrix} + \begin{bmatrix} 0 \\ \vec{P}_1 \end{bmatrix}, & N_{shadow} \text{ even} \\ \vec{P}_2 + \vec{P}_1, & N_{shadow} \text{ odd} \end{cases}$$

The size of the pupil profile array for the case of submasks depends on whether the number of samples during shadow measurement is odd or even.

$$N_{pupil} = \begin{cases} N_{mask} + 1, & N_{shadow} \text{ even} \\ N_{mask}, & N_{shadow} \text{ odd} \end{cases}$$

In step 1520, the pupil profile is deconvolved from the mask. The deconvolution performed in step 1520 is similar to the deconvolution performed in step 1514 with the exception that the mask is not broken into submasks. In an embodiment, Singular Value Decomposition is used to provide a numerically robust solution of the system of linear equations represented by the mask and the shadow measurements.

$$M \cdot \vec{P} = \vec{\tau}$$

The size of the pupil in this case is simply the mask column size.

$$N_{pupil} = N_{mask}$$

In step 1530, the profile is normalized. Because the pupil profile will be used as a filter function, the profile is normalized so that the distribution sums to unity, according to the following equation.

$$\vec{P}_i = \frac{\vec{P}_i}{\sum_{j=0}^{N_{pupil}-1} \vec{P}_j}, \quad \forall i \in \{0, 1, \ldots, N_{pupil} - 1\}$$

FIG. 16 depicts a flowchart 1600 of a method for determining the transmission mask at x-shadow position $x_n$ (step 1506), according to an embodiment of the invention. Flowchart 1600 is described with continued reference to the exemplary embodiments depicted in FIGS. 7-10. However, the invention is not limited to those embodiments. Note that some steps shown in flowchart 1600 do not necessarily have to occur in the order shown. Flowchart 1600 begins in step 1602 when transmission mask build is started.

In step 1610, sample position $x_n$ is determined. For purposes of determining the mask entry for the current row, zero is defined to be the coordinate of the first sample.

$$x_n = \frac{n}{R_{pupil}}, \quad \forall n \in \{0, 1, \ldots, N_{shadow} - 1\}$$

$R_{pupil}$=X-pupil resolution (i.e., step size between pupil samples)

In step 1620, correction element edge positions relative to sample $x_n$ are determined. Ultimately, the range of column indices into the current row of the mask matrix whose entries must be set to zero is determined. To start, the location of the correction element edges with respect to the current sample point (i.e., row in the mask) are determined. The negative edge ($x^{f-}$) is determined from the negative-most x-coordinate in the correction element in the correction element shape list ($V_{x,y}$). Likewise, the positive edge ($x^{f+}$) is determined from the positive-most x-coordinate in that list. In an embodiment, the x-coordinates in the correction element shape list, $V_{x,y}$, are relative to the centerline of the correction element and the y-coordinates are relative to the tip of the correction element.

In an embodiment, the positive and negative edges are determined using the following equations:

$$x_n^{f-} = \hat{W}_{pupil} + \frac{1}{2} \Delta X_{pupil} + \vec{V}_{x^-} - x_n$$

$$x_n^{f+} = \hat{W}_{pupil} + \frac{1}{2} \Delta X_{pupil} + \vec{V}_{x^+} - x_n$$

$$\forall n \in \{0, 1, \ldots, N_{shadow} - 1\}$$

In step 1630, the indices of the correction element edges are determined using the pupil resolution. Note that this calculation may result in one or both of the indices lying out of the matrix. The situation indicates either that the pupil and correction element do not intersect, or that the correction element blocks only part of the pupil.

$$idx_n^{f-} = \text{ceiling}(R_{pupil} \cdot x_n^{f-})$$

$$idx_n^{f+} = \text{floor}(R_{pupil} \cdot x_n^{f+})$$

$$\forall n \in \{0, 1, \ldots, N_{shadow}-1\}$$

In step 1640, valid columns in row n are zeroed. For each row, if one or both of the correction element indices lies within the valid range of columns in the mask, then for the set of indices that intersects the mask index set, a value of zero is stored in the appropriate element of the mask. The other columns of the row contain a value of 1.

If $idx_n^{f-} \leq N_{mask}-1$ and $idx_n^{f+} \geq 0$

Then $M_{n,z_n}=0.0$ $$z_n \in \{\max(0, idx_n^{f-}), \ldots, \min(idx_n^{f+}, N_{mask}-1)\}$$

$$\forall n \in \{0, 1, \ldots, N_{shadow}-1\}$$

In step 1650, a determination is made whether all x positions have been processed. If all x positions have been processed, operation proceeds to step 1690. If not all x positions have been processed, operation returns to step 1610.

In step 1690, processing returns to flowchart 1500.

3.3 Method for Determining Correction Element Position

The method for determining correction element position uses, among other items, the open slot profile, a list of one or more target profiles and the calibration data collected by the methods described above. With this input information, the method determines the position each correction element in the uniformity correction system must have to produce a target profile while simultaneously satisfying performance requirements with respect to uniformity, ellipticity, transmission, etc.

FIG. 17 depicts a flowchart 1700 of a method for determining the position of one or more correction elements (step 1150), according to an embodiment of the invention. Flowchart 1700 is described with continued reference to the exemplary embodiments depicted in FIGS. 7-10. However, the invention is not limited to those embodiments. Note that some steps shown in flowchart 1700 do not necessarily have to occur in the order shown. Flowchart 1700 begins in step 1702 when correction element position calculation is started.

In step 1710, preparatory computations are made. This step is optional. In an embodiment, one or more preparatory computations are made in order to minimize calibration time and correction element position computation time. For example, to reduce measurement time, the uniformity profile is measured on a less dense grid. The measured profile is then interpolated onto a denser grid for the correction element position processing.

In a further example, certain aspects related to the geometry of the correction elements with respect to the profile remain unchanged during correction element position processing. These characteristics are calculated during this step. Step 1710 is described in further detail in Section 3.3.1 below.

In step 1720, the target profile to be processed is evaluated on the same grid as the interpolated open-slot profile. In an embodiment, the target profile is described in Legendre polynomial coefficients. As would be appreciated by persons of skill in the art, any type of orthogonal polynomial description can be used to describe the target profile. The profile difference vector is determined using the following equation:

$$\vec{D}_{profile} = 1 + \vec{P}_{norm} - \vec{Q}_{norm}$$

$\vec{P}_{norm}$=normalized open slot profile $\vec{Q}_{norm}$=normalized target profile In addition, in step 1720, the theoretical loss due to profile correction is determined. The loss due to profile correction is the average intensity of the profile relative to the minimum value in the profile. This additional loss tolerance is added to ensure the correction is not over constrained. In an embodiment, the profile correction is given by the following equation.

$$\alpha_{correction} = 100 \cdot (\overline{\vec{D}_{prof} - \min\{\vec{D}_{prof}\}}) + a_{spec}$$

In step 1730, the correction element positions for the current target profile are determined. In this step, for the current target profile, an iterative constrained minimization is performed to search for the set of correction element insertions that will produced the desired results and satisfy the constraints. If a particular iteration fails to produce a profile to the required accuracy, the constraint weights are relaxed and a new search is initiated. Step 1730 is described in further detail in Section 3.3.2 below.

In step 1740, post-processing is performed. Post-processing includes saving the correction element positions for the current target profile and saving the final values for the constraints. In an embodiment, additional information is computed during processing which can be used for other components of the lithography system.

In step 1750, a determination is made whether any additional target profiles remain to be processed. If additional target profiles remain to be processed, operation returns to step 1720. If no additional target profiles remain to be processed, operation proceeds to step 1790.

In step 1790, processing ends.

3.3.1 Method for Preparing for Computation

FIG. 18 depicts a flowchart 1800 of a method for preparing for computation, according to an embodiment of the invention. Flowchart 1800 is described with continued reference to the exemplary embodiments depicted in FIGS. 7-10. However, the invention is not limited to those embodiments. Note that some steps shown in flowchart 1800 do not necessarily have to occur in the order shown. Flowchart 1800 begins in step 1802 when correction element position calculation is started.

In step 1810, the algorithm grid size is determined. In an embodiment, the measurements taken to measure the uniformity profile are on the coarsest possible grid in order to minimize the productivity impact. To ensure proper accuracy of the correction element solution, the uniformity profile and other profiles are interpolated onto a grid having sufficient density. Step 1810 determines the size of the grid. The grid resolution ($R_{grid}$) is the number of pixels per a predetermined measurement (e.g., per millimeter) at the reticle plane of the profile. The number of pixels in the grid ($N_{grid}$) are also determined in this step. In an embodiment, the grid resolution ($R_{grid}$) and number of pixels ($N_{grid}$) are determined by the following equations.

$$R_{grid} = k_x \cdot \frac{N_x - 1}{W_x}$$

$$N_{grid} = \lfloor W_x \cdot R_{grid} \rfloor + 1$$

$k_x$=scale factor applied to the number of x samples in the open slot profile so correction element position has dense enough data set with which to operate $N_x$=sample density in force when open slot profile is measured $W_x$=sample range in force when open slot profile is measured $X_{offset}$=x offset in force when open slot profile is measured $X_{shift}$=offset from field center of region in which target profile will be applied $W_t$=width of region in field over which target profile will be applied In step 1815, the open slot profile is interpolated onto the algorithm grid. In this step, a set of X coordinates spanning the nearest sample end points are defined. The measured profile is then linearly interpolated at those coordinates. First, a vector of the sample coordinates for the profile is determined. To construct the vector, the profile measurement resolution ($R_{profile}$) and a start coordinate are required. The grid coordinates are based on the field shift and field width ($W_x$) defined for the target profiles.

$$R_{profile} = \frac{N_x - 1}{W_x}$$

-continued $$X_{min}^{profile} = -\frac{1}{2} W_x + X_{offset}$$

$$X_{min}^{grid} = \begin{cases} -\frac{1}{2} W_x + X_{offset} & \text{flat profile} \\ \left\lfloor -\frac{1}{2} W_t \cdot R_{grid} \right\rfloor / R_{grid} + X_{shift} & \text{non-flat profile} \end{cases}$$

Next, the defining functions for the profile and grid x-coordinates are specified according to the following equations.

$$\vec{X}_{profile} = X_{min}^{profile} + \frac{i}{R_{profile}}, \quad \forall\, i = \{0, 1, \ldots, N_x - 1\}$$

$$\vec{X}_{grid} = X_{min}^{grid} + \frac{j}{R_{grid}}, \quad \forall\, j = \{0, 1, \ldots, N_{grid} - 1\}$$

After the grids are defined, interpolation is performed to determine the grid profile. Details of interpolation are well-known in the art and are not discussed further herein.

$$\vec{P}_{grid} = \mathrm{int\,erp}(\vec{X}_{profile}, \vec{P}_{openslot}, N_x, \vec{X}_{grid}, N_{grid})$$

The profile is then normalized to its mean value. In an embodiment, the normalized profile is given by the following equation.

$$\vec{P}_{norm} = \begin{cases} \left(\overline{\vec{P}_{grid}}\right)^{-1} \cdot \vec{P}_{grid} & \overline{\vec{P}_{grid}} \neq 0 \\ P_{grid} + 1 & \text{otherwise} \end{cases}$$

In step 1820, the correction element tip and pupil profiles are interpolated onto an algorithm grid. For Msens evaluation during correction element optimization, an array of correction element tip offsets is required to account for the effects due to the shape of the correction element tip. FIG. 6 depicts the shape of an exemplary correction element. The correction element tip profile is determined by interpolating the correction element tip vertices onto an algorithm grid of appropriate size. The size of the vector needed to hold the correction element tip profile is determined by quantizing the width of the profile. The width is the difference between the positive-most and negative-most x-coordinates in the correction element vertex list. The number of points in the tip is given by the following equation:

$$N_{tip} = \lfloor (\nabla_{x+} - \nabla_{x-}) R_{grid} \rfloor$$

With the number of points known, an x-coordinate grid is created as the set of interpolation points, as follows:

$$\vec{X}_j^{tip} = \lceil V_{x-} \cdot R_{grid} \rceil / R_{grid} + \frac{j}{R_{grid}}, \quad \forall\, j \in \{0, 1, \ldots, N_{tip} - 1\}$$

With the grid defined, an interpolated profile for the tip is generated.

$$\vec{P}_{tip} = \mathrm{int\,erp}(\vec{V}_x, \vec{V}_y, N_{vertices}, \vec{X}^{tip}, N_{tip})$$

If the pupil resolution differs from the algorithm grid resolution ($R_{pupil} \neq R_{grid}$), the x-pupil profile must be interpolated as well. The following equations must be calculated for each of the x-pupil profiles associated with the correction elements in the 1-D Msens calibration correction element list.

$$N'_{pupil} = \left\lfloor (N_{pupil} - 1) \cdot \frac{R_{grid}}{R_{pupil}} \right\rfloor + 1$$

$$\vec{X}_i^{pupil} = \frac{i - \left\lfloor \frac{1}{2} N_{pupil} \right\rfloor}{R_{pupil}}, \quad \forall i \in \{0, 1, \ldots, N_{pupil} - 1\}$$

$$\vec{X}_j^{\prime pupil} = \frac{j - \left\lfloor \frac{1}{2} N'_{pupil} \right\rfloor}{R_{pupil}}, \quad \forall j \in \{0, 1, \ldots, N'_{pupil} - 1\}$$

$$\vec{P}^{\prime pupil} = \begin{cases} \vec{P}_{pupil}, & \text{if } R_{pupil} = R_{grid} \\ \text{int}\,erp(\vec{X}^{pupil}, \vec{P}_{pupil}, N_{pupil}, X^{\prime pupil}, N'_{pupil} & \text{otherwise} \end{cases}$$

$$P_k^{\prime pupil} = \vec{P}_{k,odd}^{\prime pupil} + \vec{P}_{k,even}^{\prime pupil}, \quad k \in \{A, B\}$$

After the X-pupil is interpolated, if necessary, the two profiles in each bank are added together to form a combined pupil profile for the bank. These two combined profiles are then renormalized to sum to unity.

$$\vec{P}_{k,i}^{\prime pupil} = 0$$

$$\forall \vec{P}_{k,i}^{\prime pupil} < 0.0, \quad k \in \{A, B\}$$

$$\hat{P}_{k,i}^{pupil} = \frac{\vec{P}_{k,i}^{\prime pupil}}{\sum_{j=0}^{N'_{pupil}-1} \vec{P}_{k,i}^{\prime pupil}}, \quad k \in \{A, B\}$$

$$\forall i \in \{0, 1, \ldots, N'_{pupil} - 1\}$$

Other embodiments are possible where distinct pupil profiles per correction element type are preserved, rather than combined, and are individually used in filtering Msens during profile computation.

$$\vec{C}_{A,j}^X = \left( \frac{N_A + 1}{2} - j \right) \cdot d_x + R_A, \quad \forall j = \{1, 2, \ldots, N_A\}$$

$$\vec{C}_{B,j}^X = \left( \frac{N_B + 1}{2} - j \right) \cdot d_x + R_B, \quad \forall j = \{1, 2, \ldots, N_B\}$$

$$N_{HalfPupil} = \left\lfloor \frac{N'_{pupil}}{2} \right\rfloor$$

$$\vec{F}_{A,j}^X = \left\lfloor \left[ \vec{C}_{A,j}^X - X_{\min}^{grid} \right] \cdot R_{grid} + \frac{1}{2} \right\rfloor + N_{HalfPupil}, \quad \forall j = \{1, 2, \ldots, N_A\}$$

$$\vec{F}_{B,j}^X = \left\lfloor \left[ \vec{C}_{B,j}^X - X_{\min}^{grid} \right] \cdot R_{grid} + \frac{1}{2} \right\rfloor + N_{HalfPupil}, \quad \forall j = \{1, 2, \ldots, N_B\}$$

$N_{A/B}$=number of correction elements per bank
$d_x$=correction element pitch
$R_{A/B}$=correction element offset In step 1830, the extended field indices are calculated per correction element. Each correction element that affects the field influences a subset of points in the profile. Step 1830 determines the range of profile pixels that each correction element influences. The field is extended a half pupil width on either side to ease the filter operation performed during profile determination.

$$N_{HalfTip} = \left\lfloor \frac{N_{tip}}{2} \right\rfloor$$

$$\vec{F}_{k,j}^{\text{Min}} = \max\left\{0, \vec{F}_{k,j}^X - N_{HalfTip}\right\}, \quad \forall j = \{1, 2, \ldots, N_k\}$$

$$\forall k \in \{A, B\}$$

$$\vec{F}_{k,j}^{\text{Max}} = \min\left\{N_{grid} + 2 \cdot N_{HalfPupil} - 1, \vec{F}_{k,j}^X + N_{HalfTip}\right\}, \quad \forall j = \{1, 2, \ldots, N_k\}$$

$$\forall k \in \{A, B\}$$

In step 1835, the active correction element tip profile indices are calculated. For all correction elements that are completely in the field, the entire correction element tip profile is used to determine the correction elements influence on the profile. For edge correction elements, only a subset of the pixels in the correction element profile is active. The remaining pixels are truncated at the edge of the field.

$$N_{ExtGrid} = N_{grid} + 2 \cdot N_{HalfPupil}$$

$$\vec{T}_{k,j}^{\text{Min}} = \begin{cases} 0, & \vec{F}_{k,j}^X \geq N_{HalfTip} \\ N_{HalfTip} - \vec{F}_{k,j}^X, & \vec{F}_{k,j}^X < N_{HalfTip} \end{cases}, \quad \forall j = \{1, 2, \ldots, N_k\}$$

$$\forall k \in \{A, B\}$$

$$\vec{T}_{k,j}^{\text{Max}} = \begin{cases} N_{tip} - 1, & \vec{F}_{k,j}^X + N_{HalfTip} \leq N_{ExtGrid} \\ N_{tip} + N_{ExtGrid} - \vec{F}_{k,j}^X - N_{HalfTip}, & \vec{F}_{k,j}^X + N_{HalfTip} > N_{ExtGrid} \end{cases}, \quad \forall j = \{1, 2, \ldots, N_k\}$$

$$\forall k \in \{A, B\}$$

In step 1825, the correction element centerline position is determined. In order to know how a correction element affects the profile, a correction element's position with respect to the profile must be determined. Because this relationship does not change for a given target profile, the correction element centerline position can be established once before correction element position determination begins.

In step 1840, the Msens offsets are calculated per correction element. This step is optional. In an alternate embodiment, the performance of this step is configurable by the user. For example, for rod-based illumination systems where the quality of the profile is good, step 1840 may be enabled. However, for certain FDE-based systems, the variation in the slope of the y-profile may dominate the Msens error. Therefore, there would be little correlation between profile shift compensation and uniformity performance. In these types of systems, step 1840 may be disabled by a user.

Because Msens is measured for only a subset of the correction elements, the accuracy of the correction element positioning is sensitive to variation in the field. If the y-profile of the illumination varies in center position or width as a fiction of x location, Msens measured at one portion of the field will not reflect the profile response of the other correction elements in the field. During profile measurement, the y-profile shift and width variation is calculated and stored as Msens Transformation Coefficients (step 1108). For each correction element, the difference between the offsets measured for the correction elements and the other correction elements in the same bank and layer is computed and stored for use during Msens evaluation. In an embodiment where Msens is measured per correction element, no offset correction is needed and this offset computation step is skipped.

To associate the field-based transformation coefficients with a correction element, the index into the profile that is nearest to the correction element center coordinate is selected for each correction element. For each correction element, the differences in its Y center and full width half maximum (FWHM) measurements and those of the appropriate correction element from the correction element list form the basis of the Msens shift for that correction element.

If $\vec{F}_{A,j}{}^X \geq -N_{HalfTip}$ and $\vec{F}_{A,j}{}^X \leq N_{ExtGrid}+N_{HalfTip}$
Then $Active_A = \{Active_A\} \cup \{j\}$,
$\forall j = \{1, 2, \ldots, N_A\}$ If $\vec{F}_{B,j}{}^X \geq -N_{HalfTip}$ and $\vec{F}_{A,j}{}^X \leq N_{ExtGrid}+N_{HalfTip}$
Then $Active_B = \{Active_B\} \cup \{j\}$,
$\forall j = \{1, 2, \ldots, N_B\}$ As would be appreciated by persons of skill in the art, other methods of identifying active correction elements are possible.

For each correction element that satisfies the above conditions, the number of the correction element is added to the list of active correction elements for that bank. At the end of this step, a list for each bank will include the numbers for all active correction elements in the field.

In step 1850, field index lists are created. Optimization of correction element insertion evaluates the correction element configuration to ensure certain transmission symmetry constraint errors are minimized. Evaluating these constraint errors requires two sets of profile indices. One set of indices is the profile index corresponding to a correction element center in each bank. The second set is the unique set of indices from both banks.

If $\vec{F}_{A,j}{}^X - N_{HalfTip} \geq 0$ and $\vec{F}_{A,j}{}^X - N_{HalfTip} \leq N_{grid}-1$
Then $Idx_A{}^{constra\ int} = \{Idx_A{}^{constra\ int}\} \cup \{\vec{F}_{A,j}{}^X - N_{HalfPupil}\}$,
$\forall j = \{1, 2, \ldots, N_A\}$ $$Idx_{k,j}^{profile} = \max\left\{\min\left\{\left\lfloor R_{profile} \cdot \left(\vec{C}_{k,j}^X - X_{\min}^{profile}\right) + \frac{1}{2}\right\rfloor, N_{grid}-1\right\}, 0\right\}, \quad \forall j = \{1, 2, \ldots, N_k\}$$

$\forall k \in \{A, B\}$ $$\Delta Y_{A,j} = \begin{cases} -\left(\vec{Y}_{center}\left(Idx_{A,j}^{profile}\right) - \vec{Y}_{center}\left(Idx_{A,n_{A,odd}}^{profile}\right)\right) - \dfrac{\vec{W}_{FWHM}\left(Idx_{A,j}^{profile}\right) - \vec{W}_{FWHM}\left(Idx_{A,n_{A,odd}}^{profile}\right)}{2}, & j\ odd \\ -\left(\vec{Y}_{center}\left(Idx_{A,j}^{profile}\right) - \vec{Y}_{center}\left(Idx_{A,n_{A,even}}^{profile}\right)\right) - \dfrac{\vec{W}_{FWHM}\left(Idx_{A,j}^{profile}\right) - \vec{W}_{FWHM}\left(Idx_{A,n_{A,even}}^{profile}\right)}{2}, & j\ even \end{cases}$$

$\forall j = \{1, 2, \ldots, N_A\}$ $$\Delta Y_{A,j} = \begin{cases} -\left(\vec{Y}_{center}\left(Idx_{B,j}^{profile}\right) - \vec{Y}_{center}\left(Idx_{B,n_{B,odd}}^{profile}\right)\right) - \dfrac{\vec{W}_{FWHM}\left(Idx_{B,j}^{profile}\right) - \vec{W}_{FWHM}\left(Idx_{B,n_{B,odd}}^{profile}\right)}{2}, & j\ odd \\ -\left(\vec{Y}_{center}\left(Idx_{B,j}^{profile}\right) - \vec{Y}_{center}\left(Idx_{B,n_{B,even}}^{profile}\right)\right) - \dfrac{\vec{W}_{FWHM}\left(Idx_{B,j}^{profile}\right) - \vec{W}_{FWHM}\left(Idx_{B,n_{B,even}}^{profile}\right)}{2}, & j\ even \end{cases}$$

$\forall j = \{1, 2, \ldots, N_B\}$

In the above equations, $n_{A,even/odd}$ and $n_{B,even/odd}$ represent the correction element numbers for the bank A and B Msens correction elements, respectively.

In step 1845, the correction elements which affect the profile are determined. Due to the size and position of the profile, not all correction elements may be involved in producing a particular profile. To reduce unnecessary computation, only the active correction elements, those which actively influence the profile, are considered. A list of indices for each bank of correction elements is produced to indicate which correction elements in that bank are active.

If $\vec{F}_{B,j}{}^X - N_{HalfTip} \geq 0$ and $\vec{F}_{B,j}{}^{X-N}{}_{HalfTip} \leq N_{grid}-1$
Then $Idx_B{}^{constra\ int} = \{Idx_B{}^{constra\ int}\} \cup \{\vec{F}_{B,j}{}^X - N_{HalfPupil}\}$,
$\forall j = \{1, 2, \ldots, N_B\}$
$Idx_{unique}{}^{constra\ int} = \{Idx_A{}^{constra\ int}\} \cup \{Idx_B{}^{constra\ int}\}$ In step 1855, a determination is made whether constraints were supplied. If constraints were not supplied, operation proceeds to step 1860. If constraints were supplied, the supplied constraints are retrieved and operation proceeds to step 1870.

In step 1860, the initial constraint parameters are set. In an embodiment, three constraints are used in the correction element position method. The X-balance constraint ensures that the difference in attenuation between neighboring correction elements (excluding the attenuation needed to set uniformity) does not vary excessively. The Y-balance constraint ensures that the difference in attenuation between opposing correction elements does not vary excessively. The transmission constraint ensures that the solution maximizes transmission. In addition, a fourth constraint, ellipticity constraint, may be used. The ellipticity constraint ensures that the solution favors the region of the field that minimizes the ellipticity that results from correction element insertion.

In an embodiment, weights are set for the constraints. For example, the constraints are weighted based both on test input and a default scaling to ensure a proper balance among constraints and between constraints and uniformity.

In step 1870, the ellipticity constraint exponent is calculated. In an embodiment, the intrinsic ellipticity constraint function is modeled as an exponentially decreasing function as the correction element is inserted more fully into the field.

$$B_{ellip} = \begin{cases} -\ln\left|\frac{0.005}{K_w(3)}\right| \cdot (\phi_{max} - Y_{ellip})^{-1}, & K_w(3) > 0 \\ 0, & \text{otherwise} \end{cases}$$

In step 1875, Msens correction element insertions are calculated. This is required because to evaluate Msens, a grid of insertion values corresponding to the Msens values is needed.

$$R_{msens} = \frac{N_{msens} - 1}{F_{max} - F_{min}}$$

$$\vec{U}_{msens} = \phi_{max} - F_{max} + \frac{j}{R_{grid}}, \quad \forall j = \{0, 1, \ldots, N_{msens} - 1\}$$

In step 1880, transmission at nominal Y setting is calculated. To ensure that no light is transmitted outside the field boundary, the correction elements have a minimum insertion that must be maintained for a given setting. Any light lost due to the requirement to define the field does not count against the light-loss requirements constraining the uniformity correction solution. Consequently, the prediction of the starting light-loss at the nominal correction element position is required.

$$P_{nom} = \text{ComputeProfile}(\phi_{max}, \vec{Y}_{nom}, P_{norm}, \ldots)$$

$$E_{nom} = \Sigma \vec{P}_{nom}$$

3.3.2 Method for Finding Correction Element Positions for the Current Target Profile For the current target profile, an iterative constrained minimization is performed to search for the set of correction element insertions that will produce the desired profile, yet also best satisfy the surrounding constraints. If a particular iteration in the search fails to produce a profile to the required accuracy, the constraint weights are relaxed and a new search is initiated.

FIG. 19 depicts a flowchart 1900 of a method for finding correction element positions for the current target profile (step 1730), according to an embodiment of the invention. Flowchart 1900 is described with continued reference to the exemplary embodiments depicted in FIGS. 7-10. However, the invention is not limited to those embodiments. Note that some steps shown in flowchart 1900 do not necessarily have to occur in the order shown. Flowchart 1900 begins in step 1902 when correction element position calculation is started.

In step 1910, the correction element positions are optimized. In an embodiment, correction element positions are found using a non-linear, constrained vector valued function optimization that minimizes both the difference between the induced profile and the target profile and the value of the various constraint functions related to ellipticity, telecentricity, and transmission performance. In an embodiment, the objective function is evaluated by a Levenberg-Marquardt algorithm. The optimization objective function is described in further detail in Section 3.3.2.1 below.

In the first iteration of loop 1910-1970, the correction element positions are set to the midpoint between the correction element nominal position and its position at full insertion. In subsequent iterations, the correction element positions are the positions determined in the previous iteration, if the process is converging. If the process is not converging, the correction element positions are a perturbed version of the positions determined in the previous iteration.

The initial correction element position array is given by the following equation:

$$\vec{U}_{correction\ elements} = \begin{cases} \varphi_{max} - 0.5 \cdot (\varphi_{min} + \vec{Y}_{nom}), & \text{initial iteration} \\ \vec{U}_{solution}, & \text{otherwise} \end{cases}$$

In an embodiment, the solution array is given by the following:

$$\vec{U}_{solution} = \text{LevenbergMarquardt}(\text{ObjFcn}, \vec{U}_{correction\ elements}, \vec{U}_{lb}, \vec{U}_{ub}, \ldots)$$

In step 1920, the profile is computed. In an embodiment, the solution returned as a result of step 1910 is used to compute the profile.

In step 1925, the profile uniformity is calculated. The correction element positioning process stops searching for a solution when the residual uniformity of the solution profile meets a given specification. Because a profile shape is being produced, the solution profile is first normalized to it mean. The difference profile is determined according to the following equation:

$$\vec{P}_{difference} = (\overline{\vec{P}}_{solution})^{-1} \cdot \vec{P}_{solution} - \vec{Q}_{norm} + 1$$

The difference profile is then fit to a polynomial as a means of filtering it. For example, the difference profile is fit to a Legendre polynomial according to the following:

$$\vec{P}_{residual} = \text{LegendreFilter}(\vec{P}_{difference}, N_{grid}, N_{fit})$$

In step 1930, a determination is made whether the uniformity meets the specification. If the uniformity meets the specification, operation proceeds to step 1990. If the uniformity does not meet the specification, operation proceeds to step 1940.

To determine whether the uniformity meets the specification, the uniformity of the residual profile must be determined. In an embodiment, the uniformity of the residual profile is calculated using the following equation:

$$Unif_{residual} = 100 \cdot \left( \frac{\max\{\vec{P}_{residual}\} - \min\{\vec{P}_{residual}\}}{\max\{\vec{P}_{residual}\} + \min\{\vec{P}_{residual}\}} \right)$$

The residual uniformity is compared with the target residual uniformity. If residual uniformity is less than or equal to the target residual uniformity then the Uniformity meets specification and the correction element positions are returned.

In step 1940, a determination is made whether the solution provided the best residual profile so far. If the solution provided the best residual profile, operation proceeds to step 1945. If the solution did not provide the best residual profile so far, operation proceeds to step 1950.

In step 1945, the correction element positions and associated data are stored.

In step 1950, a determination is made whether the iteration limit has been reached. If the iteration limit has been reached (e.g., last loop), operation proceeds to step 1990. If the iteration limit has not been reached, operation proceeds to step 1960.

In step 1960, one or more constraint weights are reduced. If the uniformity requirement was not met in step 1930, one or more constraint weights are reduced and a new search is performed at the last solution, if the solution is converging. If the solution fails to converge (e.g., because it is trapped at a local minimum) or convergence is too slow, a systematic perturbation is made to the correction element solution and a new search is performed. Step 1960 includes steps 1962-1968.

In step 1962, the weight reduction factor is computed. The weight reduction factor is constructed in such a way that the magnitude of the reduction is related to the error in uniformity for the solution, as well as the number of iterations that have been performed. In an embodiment, under certain conditions, the reduction factor is crushed down to accelerate the search for a solution. This crush factor is applied after the first iteration in the search, as well as the first iteration after a correction element perturbation event. In addition, the ratio is raised to the power of the iteration, i. This further accelerates the de-weighting. In an embodiment, the weight reduction factor is given by the following equation:

$$k_{reduction} = \begin{cases} 0.01 \cdot \left(\frac{U_{res}}{Unif_{residual}}\right)^i \\ \left(\frac{U_{res}}{Unif_{residual}}\right)^i \end{cases},$$

finished first or perturbation iteration, otherwise where i is the iteration number (starting with 1)

$U_{res}$ = target residual uniformity

As would be appreciated by persons of skill in the art, other weight reduction equations can be used with the present invention.

In step 1964, the constraint weights are reduced. In an embodiment, the new values for the constraint weights are the product of the reduction factor and the previous value of the constraint weight. This embodiment can be represented by the equation:

$$\omega_{\alpha,i+1} = k_{reduction} \cdot \omega_{\alpha,i}, \forall \alpha \in \{xbal, ybal, trans, ellip\}$$

As would be appreciated by persons of skill in the art, other methods for reducing the constraint weights can be used with the present invention.

In step 1966, a determination is made whether the convergence rate is acceptable. The rate of convergence of the solutions to the target is important, since it is possible for the process to get trapped in a local minimum. Step 1966 determines when the process is trapped in a local minimum. If the rate of convergence is not acceptable (i.e., trapped in local minimum), operation proceeds to step 1968. If the rate of convergence is acceptable, operation proceeds to step 1970. In an embodiment, the determination is made using the following equation:

$$\text{If } \frac{Unif_{residual}}{U_{previous}} \leq 0.99$$

the convergence rate is acceptable

In step 1968, the correction element positions are perturbed. When the process is trapped in a local minimum, the correction element positions are perturbed in a controlled fashion to escape the local minimum in the next search. Correction element perturbation is based on the difference in correction element position between neighboring correction elements. The first step in correction element perturbation is to determine the difference in position of neighboring correction elements.

$$\vec{U}_i^{difference} = \vec{U}_{i+1}^{solution} - \vec{U}_i^{solution}, \forall i \in \{0, 1, \ldots, \text{size of } \vec{U}_{solution} - 2\}$$

Note that the difference vector, $\vec{U}_i^{difference}$, is one element smaller than the correction element position vector. After the difference in insertion between the correction elements is determined, position offsets for two groups of correction elements are generated: correction element pairs with position differences greater than a predetermined value (e.g., 20 microns) and those that are different by the predetermined value (e.g., 20 microns) or less. The position offsets for each correction element pair are proportional to the position differences.

$$d\vec{U}_i = \begin{cases} c_1 \cdot \vec{U}_i^{difference}, & \vec{U}_i^{difference} \leq value \\ c_2 \cdot \vec{U}_i^{difference}, & \vec{U}_i^{difference} > value \end{cases}$$

$$\forall i \in \{0, 1, \ldots, \text{size of } \vec{U}_{solution} - 2\}$$

Where, for example, factors $c_1$ and $c_2$ are 0.25 and 0.5, respectively. After the displacements are computed, each correction element position is then adjusted by the sum of the displacements for each correction element pair to which it belongs. Note that end correction elements are adjusted by only one displacement.

$$\vec{U}_i^{solution} = \begin{cases} U_i^{solution} + d\vec{U}_i, & i = 0 \\ U_i^{solution} - d\vec{U}_{i-1}, & i = \text{size of } \vec{U}_{solution} - 1 \\ U_i^{solution} + d\vec{U}_i - d\vec{U}_{i-1}, & \text{otherwise} \end{cases}$$

$$\forall i \in \{0, 1, \ldots, \text{size of } \vec{U}_{solution} - 1\}$$

In step 1970, a determination is made whether the constraint weights are too weak. If constraints are deweighted too much, there is little value in continuing to search for solutions since the constraints will no longer effectively guide the solution. Constraints are considered to be too weak when they fall below a predetermined factor (e.g., 0.001) of their initial value. If the constraint weights are too weak, operation proceeds to step 1980. If the constraint weights are not too weak, operation returns to step 1910.

In step 1980, the last loop conditions are set. If the constraints are too weak, all the constraints are disabled for the next iteration.

In step 1990, processing ends.

3.3.2.1 Method for Determining Optimization Objective Function

FIG. 20 depicts a flowchart 2000 of a method for determining the optimization objective function (step 1910), according to an embodiment of the invention. Flowchart 2000 is described with continued reference to the exemplary embodiments depicted in FIGS. 7-10. However, the invention is not limited to those embodiments. Note that some steps shown in flowchart 2000 do not necessarily have to occur in the order shown. Flowchart 2000 begins in step 2002 when correction element position calculation is started.

In an embodiment, the optimization of step 1910 is performed using a non-linear least squares technique. In an alternate embodiment, the optimization is performed using a genetic algorithm. In a further embodiment, the optimization is performed using a neural network.

The optimization objective function is given a set of correction element positions which it evaluates to determine their effect on the illumination profile. The difference between the calculated profile and the target profile is computed and a difference vector is returned to the optimize correction element positions method (FIG. 19, 1910). In addition, several constraint vectors are also computed and appended to the uniformity difference vector.

The objective function evaluated during optimization determines the profile resulting from a given vector of correction element position insertions give the following steps. Essentially, a virtual grey filter profile is computed by evaluating Msens at the y-coordinate associated with each correction element tip then blurring the result by filtering with the x-pupil profile. FIG. 22 depicts the optimization function visually. As can be seen in FIG. 22, the combination of the correction element insertion vector 2210, Msens 2220, and X-pupil profile 2230 generates a virtual grey filter that is then applied to the open slot profile 2240 to obtain the predicted profile 2250.

In an embodiment, the illumination beam exhibits known telecentricity. This telecentricity can be compensated during the filtering operation described above. During compensation, filtering the grey filter by the X-pupil profile requires an extra step of calculating an off-set and using the offset during the filtering operation. In this embodiment, a function is retrieved that describes telecentricity as a function of field position. The function is then evaluated to provide an angular off-set for X-pupil. The X-pupil offset is computed using the angular offset and the known defocus of the correction element. The X-pupil offset is applied to the X-pupil profile during the filtering operation.

In step 2010, the adjusted profile is computed. For a given set of correction element positions, step 2010 evaluates Msens and creates a transmission function for each bank of fingers. The transmission function is applied to the open slot profile ($\vec{P}_{norm}$) and the adjusted profile ($\vec{P}^{adjusted}$) and attenuation mask ($\vec{A}$) vectors are generated. Step 2010 is described in further detail in Section 3.3.2.2 below.

In step 2020, the profile difference vector is computed. With the adjusted profile for the given correction element configuration, the current profile is compared with the desired profile. In step 2020, the adjusted profile is first normalized to its mean.

$$\overline{\vec{P}^{adjusted}} = (\overline{\vec{P}^{adjusted}})^{-1} \cdot \vec{P}^{adjusted}$$

$$\vec{D}_{prof} = \overline{\vec{P}}_{adjusted} - \vec{Q}_{norm}$$

$\vec{Q}_{norm}$ = normalized target profile

In step 2030, a determination is made whether the x-balance weight is greater than zero. If the x-balance weight is greater than zero, operation proceeds to step 2035. If the x-balance weight is not greater than zero, operation proceeds to step 2040.

In step 2035, the x-balance vector is computed. The x-balance constraint causes the optimization process to favor solutions that minimize the difference in attenuation between neighboring correction elements. Generally, one correction element is inserted only slightly more than a neighboring correction element. In the double-sided configuration of a uniformity correction system, two vectors are created from the skylines of the correction element. The attenuation profile is then multiplied by the open slot profile for each bank. The pixels at the centers of neighboring correction elements are subtracted to form the constraint error function residual. A weight is then applied. The x-balance vector ($\vec{f}_{k,j}^{xbal}$) is determined by the following equations:

$$\vec{I}_{k,i} = \vec{A}'_{k,i} \cdot \vec{P}_i^{norm}, \forall k \in \{A, B\}$$

$$\forall i \in \{0, 1, \ldots, N_{grid} - 1\}$$

$$\vec{f}_{k,j}^{xbal} = \omega_{xbal}(\vec{I}_{k,Idx_{k,j}^{constra\ int}} - \vec{I}_{k,Idx_{k,j+1}^{constra\ int}}),$$
$$\forall k \in \{A, B\}$$

$$\forall j \in \{0, 1, \ldots, \text{length of } Idx_k^{constra\ int} - 2\}$$

In step 2040, a determination is made whether the y-balance weight is greater than zero. If the y-balance weight is greater than zero, operation proceeds to step 2045. If the y-balance weight is not greater than zero, operation proceeds to step 2050.

In step 2045, the y-balance vector is computed. The y-balance constraint causes the optimization routine to favor solutions that minimize the difference in attenuation between the positive and negative Y edges of the field. The pixels at the centers of opposing fingers are subtracted to form the constraint error function residual. The error vector is scaled in such a way that if too much attenuation occurs on one side of the field, the error magnitude grows. This additional balancing effect forces solutions that minimize y-telecentricity. The y-balance vector ($\vec{f}_{k,j}^{ybal}$) is determined by the following equations:

$$\vec{f}_{k,j}^{ybal} = \omega_{ybal} \cdot \left(1 + 10\left|\sum_i (\vec{I}_{B,j} - \vec{I}_{A,j})\right|\right) \cdot \left(\vec{I}_{B,Idx_{unique,j}^{constraint}} - \vec{I}_{A,Idx_{unique,j}^{constraint}}\right)$$

$\forall\, j \in \{0, 1, \ldots, \text{length of } Idx_{unique}^{constraint} - 1\}$ In step 2050, a determination is made whether the transmission weight is greater than zero. If the transmission weight is greater than zero, operation proceeds to step 2055. If the transmission weight is not greater than zero, operation proceeds to step 2060.

In step 2055, the transmission vector is computed. The transmission constraint leads the optimization routine to favor solutions that minimize the overall attenuation of the beam. To be more precise, the constraint error function is zero if the attenuation of the given correction element solution falls below the attenuation specification. Once the solution produces more loss than is specified, the attenuation as a function of field position is weighted by the error to favor solutions that minimize intensity attenuation. The transmission vector ($\vec{f}_j^{trans}$) is determined using the following equation:

$$\vec{A}_i^{profile} = \sum_k \vec{A}_{k,i}', \; k \in \{A, B\}$$

$\forall\, i \in \{0, 1, \ldots, N_{grid} - 1\}$ $$\vec{f}_j^{trans} = \omega_{trans} \cdot \max\left\{100 \cdot \left(1 - \frac{\sum_i \vec{P}_i^{adjusted}}{E_{nom}}\right) - \alpha_{corrected}, 0.0\right\} \cdot \vec{A}_{Idx_{unique,j}^{constraint}}^{profile}$$

$\forall\, j \in \{0, 1, \ldots, \text{length of } Idx_{unique}^{constraint} - 1\}$ In step 2060, a determination is made whether the ellipticity weight is greater than zero. This step is optional. If the ellipticity weight is greater than zero, operation proceeds to step 2065. If the ellipticity weight is not greater than zero, operation proceeds to step 2070.

In step 2065, the ellipticity vector is computed. This step is optional. For rod-based illuminators, there is a region near the edge of the field where correction element insertion produces a large ellipticity. Operating in the flat region of the field produces a significantly lower effect on ellipticity. This constraint imposes a heavy penalty on correction element solutions that are operating in this high-ellipticity region. The ellipticity vector ($\vec{f}_{k,j}^{ellip}$) is determined using the following equations:

$$\vec{f}_{k,j}^{ellip} = \omega_{ellip} \cdot e^{\beta_{ellip} \cdot \vec{U}_{k,j}^x}, \; \forall k \in \{A, B\}$$

$\forall j \in \{0, 1, \ldots, \text{number of active fingers} - 1\}$

In step 2070, the edge correction element vector is computed. The leftmost and rightmost correction elements affecting the active region of the field have a reduced, but still significant, influence on the field. Their influence is weak enough that they are not properly controlled by the performance constraints, but it is strong enough that poor positioning will negatively impact uniformity. For that reason, the four active correction elements that are at the extremes of the field are constrained to match their insertion to that of their nearest neighbor.

$$\vec{f}^{edge} = \begin{bmatrix} \vec{U}_{Aleft}^x - \vec{U}_{Aleft+1}^x \\ \vec{U}_{Bleft}^x - \vec{U}_{Bleft+1}^x \\ \vec{U}_{Aright}^x - \vec{U}_{Aright-1}^x \\ \vec{U}_{Bright}^x - \vec{U}_{Bright-1}^x \end{bmatrix}^T$$

In step 2080, the vectors are combined. The objective function generates a vector that contains the profile difference vector ($\vec{D}_{prof}$) and the weighted constraint error vectors for any active constraints (i.e., those constraints with a positive weighting factor.) If a particular constraint was disabled, no entry exists for that constraint in the vector.

$$\vec{f}^{edge} = \begin{bmatrix} \vec{D}_{prof} \\ \vec{f}_k^{xbal}, \omega_{xbal} > 0 \\ \{0\}, \omega_{xbal} \leq 0 \\ \vec{f}_k^{ybal}, \omega_{ybal} > 0 \\ \{0\}, \omega_{ybal} \leq 0 \\ \vec{f}^{trans}, \omega_{trans} > 0 \\ \{0\}, \omega_{transl} \leq 0 \\ \vec{f}_k^{ellip}, \omega_{ellip} > 0 \\ \{0\}, \omega_{ellip} \leq 0 \\ \vec{f}^{edge} \end{bmatrix}^T, \forall k \in \{A, B\}$$

3.3.2.2 Method for Computing the Adjusted Profile

FIG. 21 depicts a flowchart 2100 of a method for computing the profile that results from a particular setting of correction element positions, according to an embodiment of the invention. Flowchart 2100 is described with continued reference to the exemplary embodiments depicted in FIGS. 7-10. However, the invention is not limited to those embodiments. Note that some steps shown in flowchart 2100 do not necessarily have to occur in the order shown. Flowchart 2100 begins in step 2102 when adjusted profile computation is started.

In step 2110, the correction element attenuation matrix is initialized. The correction element attenuation matrix contains two rows of multipliers (one per bank) that scale a profile by the amount of attenuation produced by the correction elements of the corresponding bank. The matrix has the same number of columns as the extended profile.

In step 2120, the attenuation profile for the current correction element is determined. For each active correction element, the attenuation at each point in the extended profile corresponding to a point on the correction element tip is determined. The attenuation value is determined by the amount each point on the correction element tip is inserted into the field. The amount of insertion is used, along with the profile offset value for the correction element, to evaluate Msens for the correction element tip at each point in its profile.

$$\vec{\alpha}_{k,i}{}^j = \max\{0.0, \text{int erp}(\vec{U}_{msens}, M_{sens}, N_{msens}, \vec{P}_i{}^{tip} + \vec{U}x_j - \Delta \vec{Y}_{k,j}, 1\}$$

$$\forall i \in \{\vec{T}_{k,j}{}^{Min}, \ldots, \vec{T}_{k,j}{}^{Max}\}, \forall k \in \{A,B\}, \text{ for all fingers } j$$

$\vec{U}_{msens}$=Msens correction element insertion points (calculated in step 1875)

$\vec{P}_{tip}$=correction element tip profile (calculated in step 1820)

In step 2130, the correction element attenuation profiles are combined. After the attenuation profile for the correction element is determined, the profile must be combined with the profiles of the preceding fingers to form its portion of the attenuation matrix. In an embodiment where the correction elements are all opaque and there is substantial overlap with neighboring fingers, only the maximum attenuation for a given profile point will be saved in the matrix. The attenuation profile is given by the following equations.

$$\vec{A}_{k,i} = \max\{\vec{A}_{k,i}, \alpha_{k,i}{}^j\}$$

$$\forall h \in \{\vec{T}_{k,j}{}^{Min}, \ldots, \vec{T}_{k,j}{}^{Max}\}, \forall i \in \{\vec{F}_{k,j}{}^{Min}, \ldots, \vec{F}_{k,j}{}^{Max}\}, \forall k \in \{A,B\}, \text{ for all fingers } j$$

In step 2140, a determination is made whether all active correction elements have been processed. If not all active correction elements have been processed, operation returns to step 2120. If all active correction elements have been processed, operation proceeds to step 2150.

In step 2150, the attenuation profiles are filtered with the pupil. The attenuation profile computed to this point represents the attenuation that would result in an infinitesimally thin pupil were illuminating the profile. In step 2150, the x-pupil profile is applied as if it were a finite-impulse response filter on the attenuation data.

$$\vec{A}'_{k,i} = \vec{A}_{k,i+j} \hat{P}'_{k,j}{}^{pupil}$$

$$\forall i \in \{0, 1, \ldots, N_{grid}-1\}, \forall j \in \{0, 1, \ldots, N'_{pupil}-1\}, \forall k \in \{A,B\}$$

$\hat{P}'^{pupil}$=x-pupil profile (calculated in step 1820)

In step 2160, a determination is made whether all banks have been processed. If not all banks have been processed, operation returns to step 2150. If all banks have been processed, operation proceeds to step 2170.

Steps 2110-2160 are referred to as a skyline approach. FIG. 24 depicts an exemplary skyline for a portion of one bank of overlapping correction elements, according to an embodiment of the present invention. As can be seen in FIG. 24, the correction element coordinates are determined based on the insertion of the correction element. Msens for the corresponding correction element is applied to each coordinate insertion. The maximum attenuations are selected to create the attenuation "skyline." Application of the 1-D pupil profile blurs the skyline to capture the x-penumbra. Note that obscured correction element coordinates are ignored.

In step 2170, an attenuation mask is applied to the profile. The attenuation mask is applied to a given profile to determine the profile that results from the given correction element configuration. To apply the mask, the attenuation of each bank is summed for each point and the resulting total attenuation vector is applied point by point to the profile vector. The resulting adjusted profile is given by the following equations:

$$\vec{P}_i{}^{adjusted} = \left(1 - \sum_k \vec{A}'_{k,j}\right) \cdot \vec{P}_i{}^{norm}$$

$$\forall i \in \{0, 1, \ldots, N_{grid}-1\}, \forall k \in \{A, B\}$$

4. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A uniformity correction system for adjusting the uniformity of an illumination field used in a lithography system, comprising:
a first plurality of adjacent winged correction elements, which are inserted into the illumination field from a first edge of a uniformity correction slit during illumination; and
a second plurality of adjacent winged correction elements, which are inserted into the illumination field from a second edge of the uniformity correction slit during illumination;
wherein each winged correction element has a first protrusion on a first longitudinal edge and a second protrusion on a second longitudinal edge, substantially opposite the first protrusion.

2. The uniformity correction system of claim 1, wherein each correction element has an upper longitudinal section and a lower longitudinal section, wherein the first protrusion and the second protrusion are located in the upper longitudinal section of each correction element, and
wherein a portion of the upper longintudinal section of the correction element is inserted into the illumination field.

3. The uniformity correction system of claim 1, wherein the first protrusion has a first shape and the second protrusion has a second shape.

4. The uniformity correction system of claim 3, wherein the shape of the first protrusion is substantially a mirror image of the shape of the second protrusion.

5. The uniformity correction system of claim 3, wherein:
the first protrusion has a first outer edge and a first sloped edge between the first outer edge and a flat tip of each of the correction elements, and
the second protrusion has a second outer edge and a second sloped edge between second outer edge and the flat tip of each of the correction elements.

6. The uniformity correction system of claim 5, wherein the slope of the first sloped edge and the slope of the second sloped edge are related to a slope of a maximum gradient of the scan-integrated intensity of the illumination field.

7. The uniformity correction system of claim 5, wherein an angle defined by the flat tip of each of the correction elements and the second sloped edge and an angle defined by the flat tip of each of the correction elements and the first sloped edge are related to the angle of a maximum gradient of the scan-integrated intensity of the illumination field.

8. The uniformity correction system of claim 1, wherein the second plurality of correction elements are staggered relative to the first plurality of correction elements.

9. The uniformity correction system of claim 1, wherein the first plurality of correction elements are directly opposed to the second plurality of correction elements.

10. The uniformity correction system of claim 1, wherein the plurality of winged correction elements are overlapped in a configuration such that an outer edge of the first protrusion and an outer edge of the second protrusion for each winged correction element inserted into the illumination field are substantially covered by an adjacent winged correction element.

11. The uniformity correction system of claim 1, wherein the first plurality of winged correction elements and the second plurality of winged correction elements are inserted into the illumination field in a configuration to minimize the local gradient of the scan-integrated illumination field, whereby the uniformity ripple is minimized.

* * * * *

UNITED STATES PATENT AND TRADEMARK OFFICE
CERTIFICATE OF CORRECTION

PATENT NO. : 7,525,641 B2
APPLICATION NO. : 11/295517
DATED : April 28, 2009
INVENTOR(S) : Richard C. Zimmerman Page 1 of 1

It is certified that error appears in the above-identified patent and that said Letters Patent is hereby corrected as shown below:

On the Title Page, Item (75) under "Inventors," "Roberto B. Wiener, Eindhoven (NL)" should be --Roberto B. Wiener, Bethel (CT)--.

Signed and Sealed this

Twenty-seventh Day of October, 2009

David J. Kappos
*Director of the United States Patent and Trademark Office*